(12) United States Patent
Hu et al.

(10) Patent No.: US 9,741,718 B2
(45) Date of Patent: Aug. 22, 2017

(54) HIGH VOLTAGE CMOS WITH TRIPLE GATE OXIDE

(71) Applicant: Texas Instruments Incorporated, Dallas, TX (US)

(72) Inventors: Binghua Hu, Plano, TX (US); Pinghai Hao, Plano, TX (US); Sameer Pendharkar, Allen, TX (US); Seetharaman Sridhar, Richardson, TX (US); Jarvis Jacobs, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/803,759

(22) Filed: Jul. 20, 2015

(65) Prior Publication Data
US 2015/0325577 A1    Nov. 12, 2015

Related U.S. Application Data

(62) Division of application No. 13/663,015, filed on Oct. 29, 2012, now Pat. No. 9,117,687.
(Continued)

(51) Int. Cl.
*H01L 21/8238* (2006.01)
*H01L 27/092* (2006.01)
(Continued)

(52) U.S. Cl.
CPC .......... *H01L 27/092* (2013.01); *H01L 21/761* (2013.01); *H01L 21/823814* (2013.01);
(Continued)

(58) Field of Classification Search
CPC .... H01L 21/761; H01L 29/78–29/7856; H01L 29/0852; H01L 29/1045;
(Continued)

(56) References Cited

U.S. PATENT DOCUMENTS 5,156,989 A    10/1992 Williams et al.
6,177,322 B1 *  1/2001 Derhacobian ....... H01L 29/1033
                                                          257/E21.433
(Continued)

OTHER PUBLICATIONS

Chen et al. A Sub-half Micron Partially Gate-to-Drain Overlapped MOSFET Optimized for High Performance and Reliability. IEEE 1991.*

*Primary Examiner* — Eric Ward
*Assistant Examiner* — Eric Ashbahian
(74) *Attorney, Agent, or Firm* — Jacqueline J. Garner; Charles A. Brill; Frank D. Cimino

(57) ABSTRACT

An integrated circuit containing a first plurality of MOS transistors operating in a low voltage range, and a second plurality of MOS transistors operating in a mid voltage range, may also include a high-voltage MOS transistor which operates in a third voltage range significantly higher than the low and mid voltage ranges, for example 20 to 30 volts. The high-voltage MOS transistor has a closed loop configuration, in which a drain region is surrounded by a gate, which is in turn surrounded by a source region, so that the gate does not overlap field oxide. The integrated circuit may include an n-channel version of the high-voltage MOS transistor and/or a p-channel version of the high-voltage MOS transistor. Implanted regions of the n-channel version and the p-channel version are formed concurrently with implanted regions in the first and second pluralities of MOS transistors.

8 Claims, 32 Drawing Sheets

Related U.S. Application Data

(60) Provisional application No. 61/552,514, filed on Oct. 28, 2011.

(51) Int. Cl.

| | | |
|---|---|---|
| *H01L 29/10* | (2006.01) | |
| *H01L 29/40* | (2006.01) | |
| *H01L 29/08* | (2006.01) | |
| *H01L 29/417* | (2006.01) | |
| *H01L 21/761* | (2006.01) | |
| *H01L 29/78* | (2006.01) | |
| *H01L 29/423* | (2006.01) | |
| *H01L 29/45* | (2006.01) | |
| H01L 29/06 | (2006.01) | |
| H01L 29/49 | (2006.01) | |
| H01L 29/66 | (2006.01) | |

(52) U.S. Cl.
CPC .. *H01L 21/823878* (2013.01); *H01L 29/0692* (2013.01); *H01L 29/0847* (2013.01); *H01L 29/1045* (2013.01); *H01L 29/1095* (2013.01); *H01L 29/408* (2013.01); *H01L 29/41758* (2013.01); *H01L 29/42364* (2013.01); *H01L 29/456* (2013.01); *H01L 29/66659* (2013.01); *H01L 29/7833* (2013.01); *H01L 29/7835* (2013.01); *H01L 29/7836* (2013.01); *H01L 29/06* (2013.01); *H01L 29/0653* (2013.01); *H01L 29/1033* (2013.01); *H01L 29/1083* (2013.01); *H01L 29/1087* (2013.01); *H01L 29/4933* (2013.01); *H01L 29/665* (2013.01)

(58) Field of Classification Search
CPC ......... H01L 29/66674; H01L 29/66681; H01L 29/66712
See application file for complete search history.

(56) References Cited

U.S. PATENT DOCUMENTS

| | | | | |
|---|---|---|---|---|
| 7,411,271 | B1* | 8/2008 | Ma | H01L 21/823878 257/545 |
| 7,683,426 | B2* | 3/2010 | Williams | H01L 21/761 257/335 |
| 8,258,575 | B2* | 9/2012 | Williams | H01L 21/761 257/349 |
| 8,536,009 | B2* | 9/2013 | Javorka | H01L 21/823412 257/392 |
| 8,623,732 | B2* | 1/2014 | Grote | H01L 29/0634 438/369 |
| 2006/0033156 | A1* | 2/2006 | Huang | H01L 29/0634 257/335 |
| 2007/0132033 | A1* | 6/2007 | Wu | H01L 21/823814 257/371 |
| 2008/0054356 | A1 | 3/2008 | Yoshida | |
| 2009/0102010 | A1 | 4/2009 | Ema et al. | |
| 2011/0024839 | A1* | 2/2011 | Zinn | H01L 29/086 257/343 |
| 2011/0062547 | A1 | 3/2011 | Onishi et al. | |
| 2011/0175168 | A1* | 7/2011 | Wang | H01L 21/823807 257/369 |
| 2012/0161230 | A1* | 6/2012 | Satoh | H01L 29/66681 257/335 |
| 2012/0267724 | A1* | 10/2012 | Venkatesan | H01L 29/1083 257/402 |

* cited by examiner

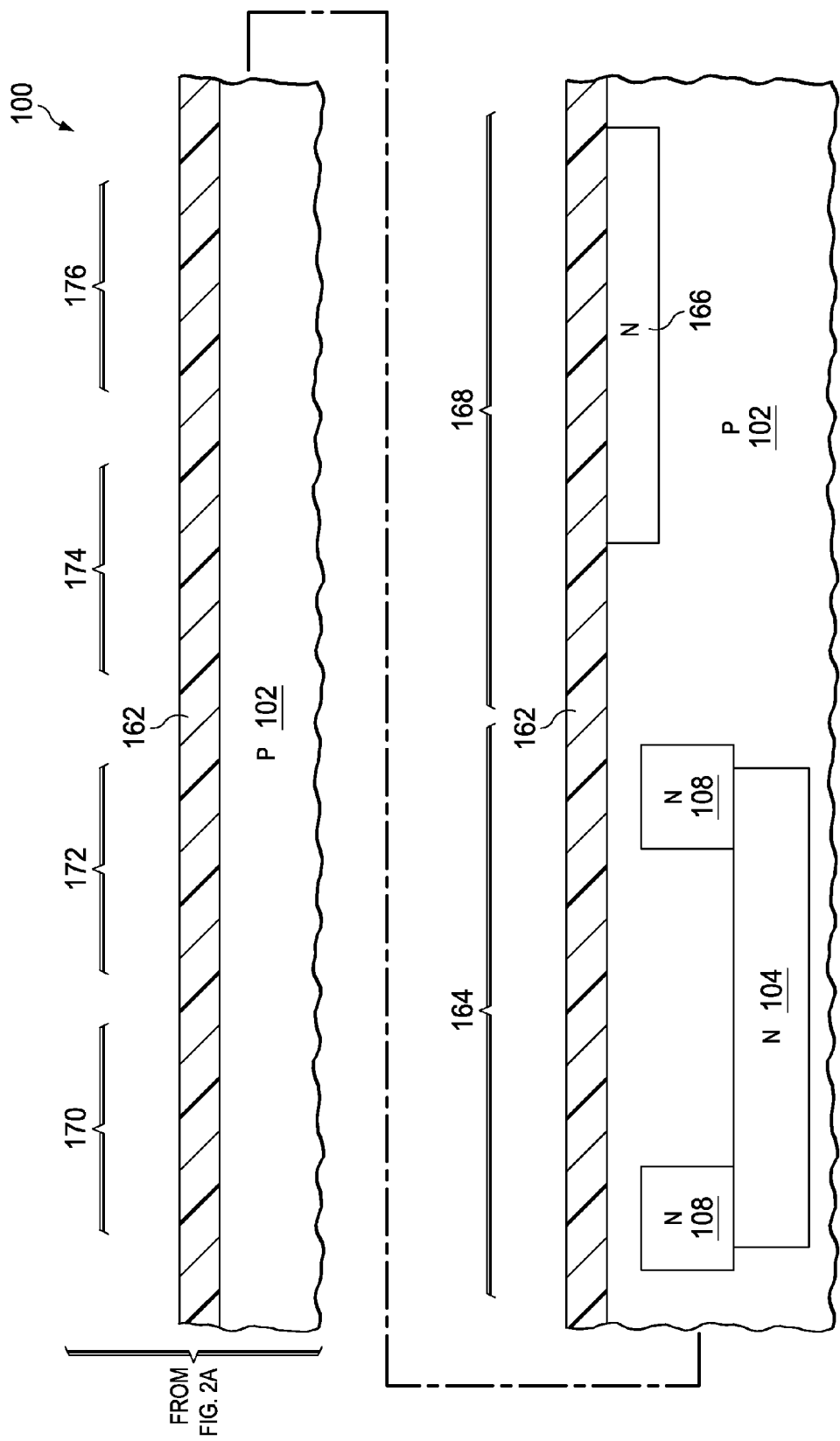

HIGH VOLTAGE CMOS WITH TRIPLE GATE OXIDE

CROSS REFERENCE TO RELATED APPLICATIONS

This application is a divisional of U.S. Nonprovisional patent application Ser. No. 13/663,015, filed Dec. 29, 2012, which claims priority of U.S. provisional application Ser. No. 61/552,514, filed Dec. 28, 2011, the contents of both of which are herein incorporated by reference in its entirety.

FIELD OF THE INVENTION

This invention relates to the field of integrated circuits. More particularly, this invention relates to MOS transistors in integrated circuits.

BACKGROUND OF THE INVENTION

An integrated circuit may include a plurality of metal oxide semiconductor (MOS) transistors which operate at in a low voltage range, for example 1 to 2 volts, and a second plurality of transistors which operate in a mid voltage range, for example 3 to 5 volts. It may be desirable to form circuits in the integrated circuit which can operate in a third voltage range which is significantly higher than the low and mid voltage ranges, for example 20 to 30 volts.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit containing a first plurality of MOS transistors operating in a low voltage range, for example less than 3 volts, and a second plurality of MOS transistors operating in a mid voltage range, for example 3 to 5 volts, may also include a high-voltage MOS transistor which operates in a third voltage range significantly higher than the low and mid voltage ranges, for example 20 to 30 volts. The high-voltage MOS transistor has a closed loop configuration, in which the drain region is surrounded by the gate, which is in turn surrounded by the source region, so that the gate does not overlap field oxide.

An n-channel version of the high-voltage MOS transistor may be formed in a p-type substrate by a process including: implanting and annealing n-type dopants in source and drain extension regions concurrently with drain extension regions in extended-drain n-channel MOS transistors in the integrated circuit, forming field oxide so as to laterally surround the source region, forming a silicon nitride layer over a dummy oxide layer, patterning the silicon nitride layer to expose an area for a gate dielectric layer of the high-voltage MOS transistor and removing the silicon nitride and dummy oxide in the exposed area, growing a gate oxide for the high-voltage MOS transistor in the exposed area, implanting p-type a threshold adjustment dopants in the channel region, forming a gate dielectric layer for the first plurality of MOS transistors and a gate dielectric layer for the second plurality of MOS transistors, forming a gate of the high-voltage MOS transistor concurrently with gates of the first and second pluralities of MOS transistors, implanting n-type dopants in source and drain contact regions of the high-voltage MOS transistor concurrently with source and drain regions of n-channel MOS transistors in the first and second pluralities of MOS transistors, and forming a silicide block layer overlapping the gate of the high-voltage MOS transistor so as to provide lateral separation between the gate and silicided areas of the source and drain regions.

A p-channel version of the high-voltage MOS transistor may be formed in a p-type substrate by a process including: forming an n-type buried layer under an area for the high-voltage MOS transistor and forming n-type connecting regions over the buried layer to provide connections to the buried layer at body contact areas outside the source region and at the channel region, implanting n-type threshold adjustment dopants in the channel region, forming field oxide so as to laterally surround the source region, forming a silicon nitride layer over a dummy oxide layer, patterning the silicon nitride layer to expose an area for a gate dielectric layer of the high-voltage MOS transistor and removing the silicon nitride and dummy oxide in the exposed area, growing a gate oxide for the high-voltage MOS transistor in the exposed area, implanting and annealing p-type dopants in source and drain extension regions concurrently with p-type wells for re-channel MOS transistors in the first and second pluralities of MOS transistors, forming a gate dielectric layer for the first plurality of MOS transistors and a gate dielectric layer for the second plurality of MOS transistors, forming a gate of the high-voltage MOS transistor concurrently with gates of the first plurality and second plurality of MOS transistors, implanting p-type dopants in source and drain contact regions of the high-voltage MOS transistor concurrently with source and drain regions of p-channel MOS transistors in the first and second pluralities of MOS transistors, and forming a silicide block layer overlapping the gate of the high-voltage MOS transistor so as to provide lateral separation between the gate and silicided areas of the source and drain regions.

The integrated circuit may include an n-channel version of the high-voltage MOS transistor and/or a p-channel version of the high-voltage MOS transistor. The steps of forming and patterning the silicon nitride layer and growing the gate oxide layers of the n-channel version and the p-channel version are performed concurrently.

DESCRIPTION OF THE VIEWS OF THE DRAWING

FIG. 2A through FIG. 13B are cross sections of the integrated circuit 100 depicted in successive stages of fabrication.

DETAILED DESCRIPTION OF EXAMPLE EMBODIMENTS

Figure 1A:
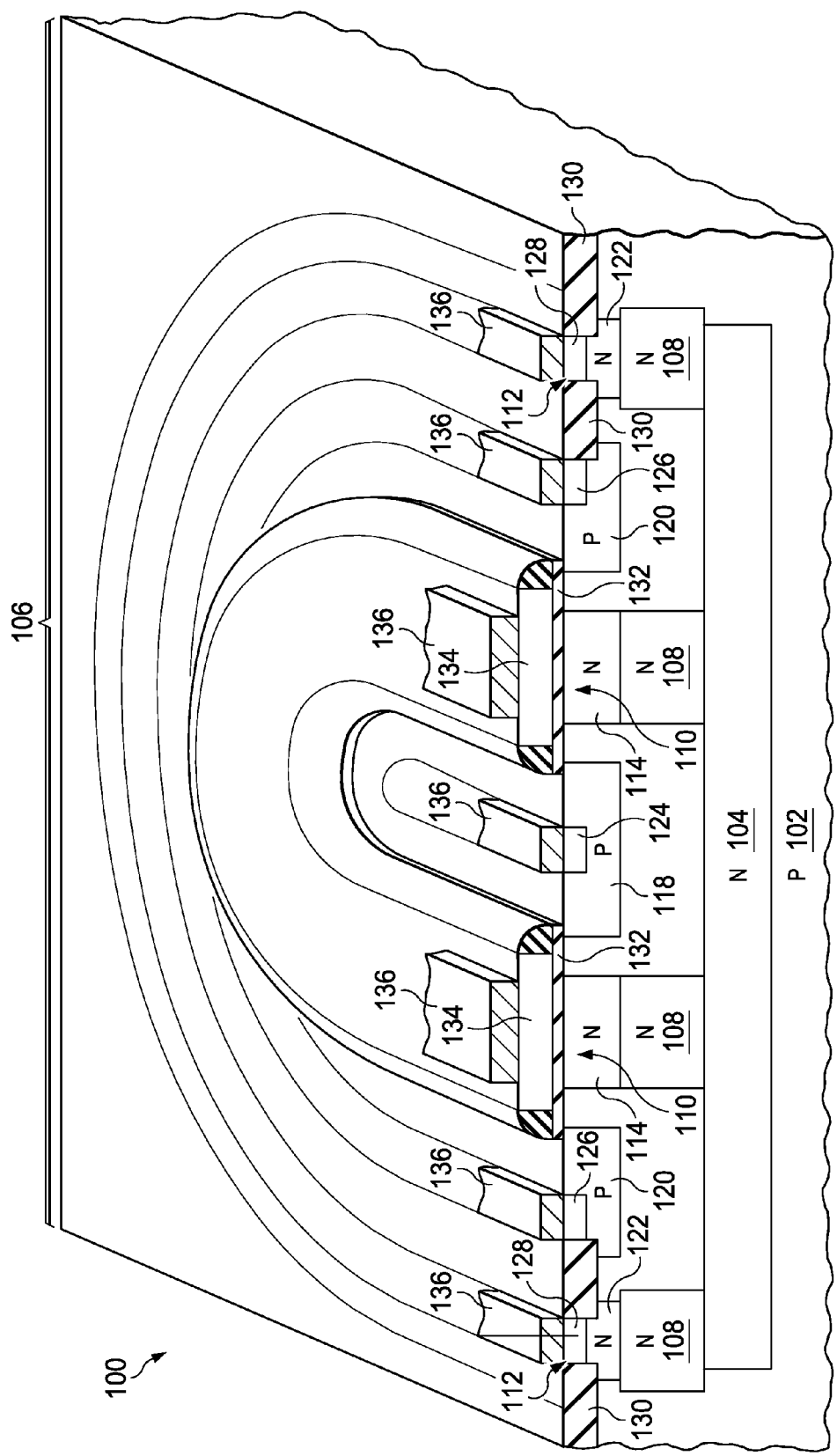
FIG. 1A is a perspective of an integrated circuit containing a p-channel high-voltage MOS transistor which operates from 20 to 30 volts, formed according to an embodiment.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit containing a first plurality of MOS transistors operating in a low voltage range, for example less than 3 volts, and a second plurality of MOS transistors operating in a mid voltage range, for example 3 to 5 volts, may also include a high-voltage MOS transistor which operates in a third voltage range significantly higher than the low and mid voltage ranges, for example 20 to 30 volts. The high-voltage MOS transistor has a closed loop configuration, in which a drain region is surrounded by a gate, which is in turn surrounded by a source region, so that the gate does not overlap field oxide.

FIG. 1A is a perspective of an integrated circuit containing a p-channel high-voltage MOS transistor which operates from 20 to 30 volts, formed according to an embodiment. The integrated circuit 100 is formed on a p-type semiconductor substrate 102 such as a silicon wafer. An n-type buried layer 104 is disposed in the substrate 102 in an area defined for the p-channel high-voltage MOS transistor 106. The buried layer 104 may be, for example, 1 to 3 microns thick, and a top surface of the buried layer 104 may be, for example, 1.8 to 4 microns below a top surface of the substrate 102. An average doping density of the buried layer 104 may be, for example, from $1 \times 10^{18}$ cm$^{-3}$ to $1 \times 10^{19}$ cm$^{-3}$. N-type connecting regions 108 are disposed in the substrate 102 under a p-channel MOS (PMOS) PMOS channel area 110 and under one or more PMOS body contact areas 112 of the p-channel high-voltage MOS transistor 106, so as to make electrical connection to the buried layer 104. Top surfaces of the connecting regions 108 do not extend to the top surface of the substrate 102. An average doping density of the connecting regions 108 may be, for example, from $3 \times 10^{17}$ cm$^{-3}$ to $3 \times 10^{18}$ cm$^{-3}$. The buried layer 104 and connecting regions 108 may be formed concurrently with other buried layers and connecting regions, not shown in FIG. 1A, under other components of the integrated circuit 100, for example isolated NMOS transistors.

An n-type PMOS threshold adjustment region 114 is disposed in the substrate 102 extending from the connecting region 108 to the top surface of the substrate 102 in the PMOS channel area 110. The PMOS threshold adjustment region 114 is electrically connected to the buried layer 104 through the connecting region 108. Dopant densities and profiles of the PMOS threshold adjustment region 114 in the PMOS channel area 110 may provide a desired threshold for the p-channel high-voltage MOS transistor 106. An average doping density of the PMOS threshold adjustment region 114 may be, for example, from $8 \times 10^{15}$ cm$^{-3}$ to $2 \times 10^{16}$ cm$^{-3}$.

A p-type PMOS drain extension 118 and a p-type PMOS source extension 120 are disposed at the top surface of the substrate 102 laterally adjacent to the PMOS threshold adjustment region 114. The PMOS drain extension 118 and the PMOS source extension 120 extend from the top surface of the substrate 102 to a depth of, for example, 400 nanometers to 1 micron. An average doping density of the PMOS drain extension 118 and the PMOS source extension 120 may be, for example, from $1 \times 10^{17}$ cm$^{-3}$ to $2 \times 10^{18}$ cm$^{-3}$. The PMOS drain extension 118 and the PMOS source extension 120 are formed concurrently, and may be formed concurrently with p-type wells under n-channel MOS (NMOS) transistors which operate at 5 volts or less, not shown in FIG. 1A, in the integrated circuit 100.

One or more n-type body links 122 are disposed at the top surface of the substrate 102 extending to, and making electrical connection to, the connecting regions 108 in the PMOS body contact areas 112. The body links 122 extend from the top surface of the substrate 102 to a depth of, for example, 400 nanometers to 1 micron. An average doping density of the body links 122 may be, for example, from $1 \times 10^{17}$ cm$^{-3}$ to $3 \times 10^{18}$ cm$^{-3}$. The body links 122 may be formed concurrently with n-type wells under PMOS transistors which operate at 5 volts or less, not shown in FIG. 1A, in the integrated circuit 100.

A p-type PMOS drain contact region 124 and a p-type PMOS source contact region 126 are disposed at the top surface of the substrate 102 in the PMOS drain extension 118 and the PMOS source extension 120, respectively. The PMOS drain contact region 124 and the PMOS source contact region 126 extend from the top surface of the substrate 102 to a depth of, for example, 50 to 300 nanometers. An average doping density of the PMOS drain contact region 124 and the PMOS source contact region 126 may be, for example, from $1 \times 10^{19}$ cm$^{-3}$ to $5 \times 10^{20}$ cm$^{-3}$. The PMOS drain contact region 124 and the PMOS source contact region 126 are formed concurrently, and may be formed concurrently with p-type source and drain regions in the PMOS transistors which operate at 5 volts or less in the integrated circuit 100.

One or more n-type PMOS body contact regions 128 are disposed at the top surface of the substrate 102 in the PMOS body contact areas 112, connecting to, and making electrical connection with, the body links 122. The PMOS body contact regions 128 extend from the top surface of the substrate 102 to a depth of, for example, 50 to 300 nanometers. An average doping density of the PMOS body contact regions 128 may be, for example, from $1 \times 10^{19}$ cm$^{-3}$ to $5\times10^{20}$ cm$^{-3}$. The PMOS body contact regions 128 may be formed concurrently with n-type source and drain regions in the NMOS transistors which operate at 5 volts or less in the integrated circuit 100.

Field oxide 130 may be formed at the top surface of the substrate 102 so as to laterally isolate the p-channel high-voltage MOS transistor 106 from other components, not shown in FIG. 1A, in the integrated circuit 100. The field oxide 130 may be, for example, silicon dioxide from 250 to 600 nanometers thick, formed by shallow trench isolation (STI) or local oxidation of silicon (LOCOS) processes. In STI processes, silicon dioxide may be deposited by high density plasma (HDP) or high aspect ratio process (HARP). The field oxide 130 may also laterally isolate the PMOS source contact region 126 from the PMOS body contact regions 128. In one version of the instant embodiment, the PMOS drain extension 118 may be free of field oxide 130, and the PMOS source extension 120 between the PMOS source contact region 126 and the PMOS threshold adjustment region 114 may be free of field oxide 130.

A high-voltage gate dielectric layer 132 is formed at the top surface of the substrate 102 over the PMOS channel area 110. The high-voltage gate dielectric layer 132 may include, for example, thermally grown silicon dioxide. A thickness of the high-voltage gate dielectric layer 132 may be adjusted to provide reliable operation of the p-channel high-voltage MOS transistor 106 at a desired operating voltage. For example, an instance of the p-channel high-voltage MOS transistor 106 which operates at 20 volts may have a gate dielectric layer of thermal oxide 40 to 50 nanometers thick. An instance of the p-channel high-voltage MOS transistor 106 which operates at 25 volts may have a gate dielectric layer of thermal oxide 55 to 70 nanometers thick. An instance of the p-channel high-voltage MOS transistor 106 which operates at 30 volts may have a gate dielectric layer of thermal oxide 85 to 100 nanometers thick.

A high-voltage PMOS gate 134 is disposed on the high-voltage gate dielectric layer 132 over the PMOS channel area 110. The high-voltage PMOS gate 134 may include, for example, polycrystalline silicon, commonly referred to as polysilicon. The high-voltage PMOS gate 134 may be formed concurrently with gates of the NMOS and PMOS transistors which operate at 5 volts or less in the integrated circuit 100. The high-voltage PMOS gate 134 has a closed loop configuration and surrounds the PMOS drain extension 118. The high-voltage PMOS gate 134 is surrounded by the PMOS source extension 120. The high-voltage PMOS gate 134 does not overlap field oxide 130.

Metal silicide 136 may be formed on the high-voltage PMOS gate 134, on the PMOS drain contact region 124, on the PMOS source contact region 126 and on the PMOS body contact regions 128. The metal silicide 136 on the high-voltage PMOS gate 134, if formed, is laterally separated from an edge of the high-voltage PMOS gate 134. Similarly, the metal silicide 136 on the PMOS drain contact region 124 and on the PMOS source contact region 126 may be laterally separated from an opposite edge of the high-voltage PMOS gate 134.

Figure 1B:
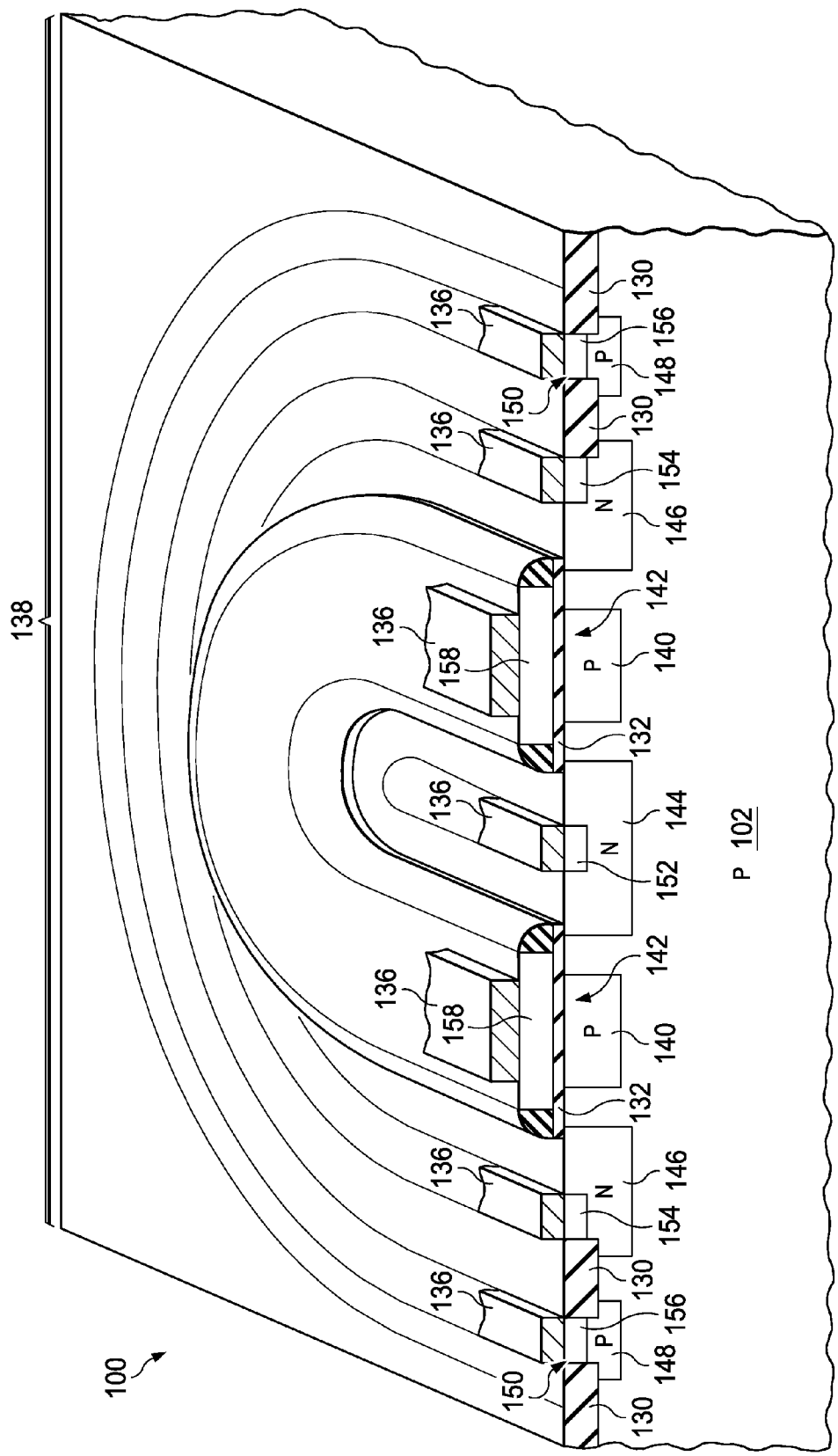
FIG. 1B is a perspective of the integrated circuit containing an n-channel high-voltage MOS transistor which operates from 20 to 30 volts, formed according to an embodiment.

FIG. 1B is a perspective of the integrated circuit containing an n-channel high-voltage MOS transistor 138 which operates from 20 to 30 volts, formed according to an embodiment. A p-type NMOS threshold adjustment region 140 is disposed in the substrate 102 extending from the top surface of the substrate 102 in an NMOS channel area 142. Dopant densities and profiles of the NMOS threshold adjustment region 140 in the NMOS channel area 142 may provide a desired threshold for the n-channel high-voltage MOS transistor 138. An average doping density of the NMOS threshold adjustment region 140 may be, for example, from $5\times10^{15}$ cm$^{-3}$ to $2\times10^{16}$ cm$^{-3}$.

An n-type NMOS drain extension 144 and an n-type NMOS source extension 146 are disposed at the top surface of the substrate 102 laterally adjacent to the NMOS threshold adjustment region 140. The NMOS drain extension 144 and the NMOS source extension 146 extend from the top surface of the substrate 102 to a depth of, for example, 400 nanometers to 1 micron. An average doping density of the NMOS drain extension 144 and the NMOS source extension 146 may be, for example, from $1\times10^{17}$ cm$^{-3}$ to $1\times10^{18}$ cm$^{-3}$. The NMOS drain extension 144 and the NMOS source extension 146 are formed concurrently, and may be formed concurrently with n-type drain extensions in extended-drain NMOS transistors, not shown in FIG. 1B, in the integrated circuit 100.

One or more p-type NMOS body contact extensions 148 are disposed at the top surface of the substrate 102 in NMOS body contact areas 150. The NMOS body contact extensions 148 extend from the top surface of the substrate 102 to a depth of, for example, 400 nanometers to 1 micron. An average doping density of the NMOS body contact extensions 148 may be, for example, from $1\times10^{17}$ cm$^{-3}$ to $1\times10^{18}$ cm$^{-3}$. The NMOS body contact extensions 148 may be formed concurrently with p-type wells under the NMOS transistors which operate at 5 volts or less, not shown in FIG. 1B, in the integrated circuit 100.

An n-type NMOS drain contact region 152 and an n-type NMOS source contact region 154 are disposed at the top surface of the substrate 102 in the NMOS drain extension 144 and the NMOS source extension 146, respectively. The NMOS drain contact region 152 and the NMOS source contact region 154 extend from the top surface of the substrate 102 to a depth of, for example, 50 to 300 nanometers. An average doping density of the NMOS drain contact region 152 and the NMOS source contact region 154 may be, for example, from $1\times10^{19}$ cm$^{-3}$ to $5\times10^{20}$ cm$^{-3}$. The NMOS drain contact region 152 and the NMOS source contact region 154 are formed concurrently, and may be formed concurrently with n-type source and drain regions in the NMOS transistors which operate at 5 volts or less in the integrated circuit 100.

One or more p-type NMOS body contact regions 156 are disposed at the top surface of the substrate 102 in the NMOS body contact areas 150, connecting to, and making electrical connection with, the NMOS body contact extensions 148. The NMOS body contact regions 156 extend from the top surface of the substrate 102 to a depth of, for example, 50 to 300 nanometers. An average doping density of the NMOS body contact regions 156 may be, for example, from $1\times10^{19}$ cm$^{-3}$ to $5\times10^{-3}$. The NMOS body contact regions 156 may be formed concurrently with p-type source and drain regions in the PMOS transistors which operate at 5 volts or less in the integrated circuit 100.

The field oxide 130 may laterally isolate the n-channel high-voltage MOS transistor 138 from other components, not shown in FIG. 1B, in the integrated circuit 100. The field oxide 130 may also laterally isolate the NMOS source contact region 154 from the NMOS body contact regions 156. In one version of the instant embodiment, the NMOS drain extension 144 may be free of field oxide 130, and the NMOS source extension 146 between the NMOS source contact region 154 and the NMOS threshold adjustment region 140 may be free of field oxide 130.

The high-voltage gate dielectric layer 132 is disposed at the top surface of the substrate 102 over the NMOS channel area 142. An high-voltage NMOS gate 158 is disposed on the high-voltage gate dielectric layer 132 over the NMOS channel area 142. The high-voltage NMOS gate 158 may be formed concurrently with the high-voltage PMOS gate 134, and/or may be formed concurrently with gates of the NMOS and PMOS transistors which operate at 5 volts or less in the integrated circuit 100. The high-voltage NMOS gate 158 has a closed loop configuration and surrounds the NMOS drain extension 144. The high-voltage NMOS gate 158 is surrounded by the NMOS source extension 146. The high-voltage NMOS gate 158 does not overlap field oxide 130.

The metal silicide 136 may be formed on the high-voltage NMOS gate 158, on the NMOS drain contact region 152, on the NMOS source contact region 154 and on the NMOS body contact regions 156. The metal silicide 136 on the high-voltage NMOS gate 158, if formed, may be laterally separated from an edge of the high-voltage NMOS gate 158. Similarly, the metal silicide 136 on the NMOS drain contact region 152 and on the NMOS source contact region 154 is laterally separated from an opposite edge of the high-voltage NMOS gate 158.

Figure 2A:
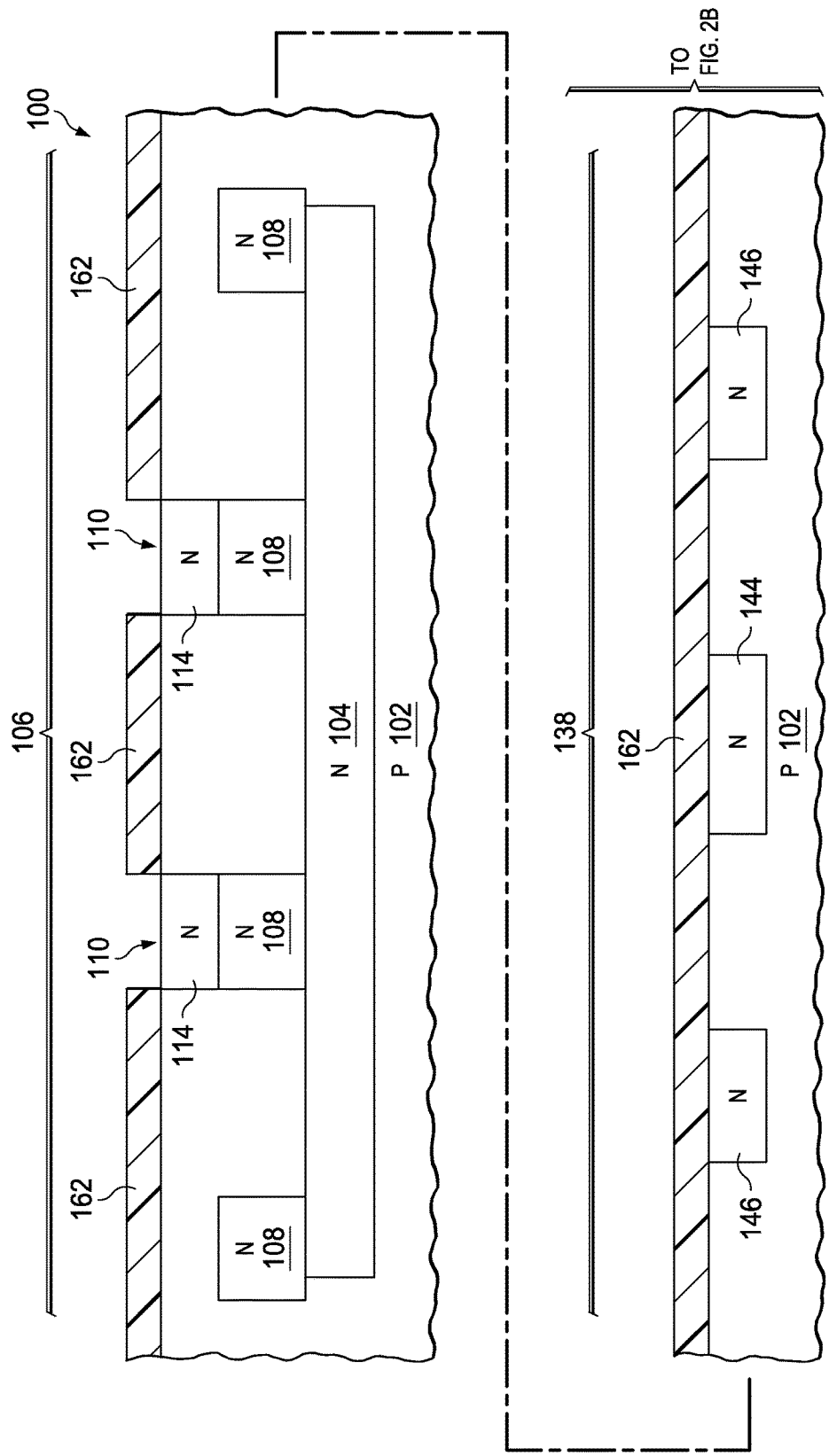

FIGS. 2A-2B through FIGS. 13A-13B are cross sections of the integrated circuit 100 depicted in successive stages of fabrication. The "A" figures illustrate the area of integrated circuit 100 for the p-channel high voltage MOS transistor 106 and the n-channel high voltage MOS transistor 130. The "B" figures illustrate the area of integrated circuit 100 for an isolated NMOS transistor 164, an extended drain NMOS transistor 168, a first (low voltage) PMOS transistor 170, a first (low voltage) NMOS transistor 172, a second (mid voltage) PMOS transistor 174, and a second (mid voltage) NMOS transistor 176. Referring to FIG. 2A and FIG. 2B, the n-type buried layer 104 is formed in the substrate 102 in the p-channel high-voltage MOS transistor 106, for example by implanting antimony through an exposed area in a buried layer implant mask, not shown, into a carrier wafer of the substrate 102 at a dose of $1\times10^{15}$ cm$^{-2}$ to $5\times10^{15}$ cm$^{-2}$, followed by a diffusion operation which heats the substrate 102 to 1150 C to 1225 C for 60 to 120 minutes, and subsequently growing a p-type epitaxial layer of semiconductor 2.5 to 5 microns thick over the buried layer 104; the epitaxial layer is subsequently considered part of the substrate 102. The epitaxial layer may have an average doping density of, for example, $5\times10^{15}$ cm$^{-3}$ to $5\times10^{16}$ cm$^{-3}$. The buried layer 104 may have an average doping density of, for example, $1\times10^{18}$ cm$^{-3}$ to $5\times10^{19}$ cm$^{-3}$. The buried layer 104 may also be formed in the substrate 102 under another component of the integrated circuit 100, in the instant embodiment, an isolated NMOS transistor 164.

The n-type connecting regions 108 are subsequently formed over the buried layer 104 in the p-channel high-voltage MOS transistor 106, for example by ion implanting phosphorus into the substrate 102 at a dose of $1\times10^{14}$ cm$^{-2}$ to $1\times10^{15}$ cm$^{-2}$, followed by subsequent thermal processes to anneal and activate the phosphorus. The connecting regions 108 may have an average doping density of, for example, $1\times10^{17}$ cm$^{-3}$ to $1\times10^{18}$ cm$^{-3}$. The thermal processes may be part of, for example field oxide formation and well anneals, so that a separate anneal operation for the connecting regions 108 may not be required. The connecting regions 108 may also be formed in the substrate 102 in the isolated NMOS transistor 164.

The NMOS drain extension 144 and the NMOS source extension 146 are formed in the n-channel high-voltage MOS transistor 138, for example by implanting phosphorus with a dose of $1\times10^{13}$ cm$^{-2}$ to $2\times10^{13}$ cm$^{-2}$ at an energy of 135 to 180 keV, and arsenic at a dose of $5\times10^{12}$ cm$^{-2}$ to $8\times10^{12}$ cm$^{-2}$ at an energy of 135 to 180 keV. In one version of the instant embodiment, a drain extension 166 of an extended-drain NMOS transistor 168 in the integrated circuit 100 may be formed concurrently with the NMOS drain extension 144 and the NMOS source extension 146. In another version, the NMOS drain extension 144 and the NMOS source extension 146 may be formed concurrently with the PMOS threshold adjustment region 114. A subsequent thermal operation, for example 30 to 60 minutes at 1075 C to 1125 C diffuses and activates the phosphorus and arsenic.

A PMOS threshold adjustment implant mask 162 is formed over the integrated circuit 100 so as to expose the PMOS channel area 110. A PMOS threshold adjustment implant process is performed which implant n-type dopants into the substrate 102 in the PMOS channel area 110 to form the n-type PMOS threshold adjustment region 114 which extends to the top surface of the substrate 102. The PMOS threshold adjustment implant process may include, for example, implanting phosphorus with a dose of $3\times10^{12}$ cm$^{-2}$ to $6\times10^{12}$ cm$^{-2}$ at an energy of 500 to 800 keV, followed by a subsequent thermal process to diffuse and activate the phosphorus. An average doping density of the PMOS threshold adjustment region 114 may be, for example, $8\times10^{15}$ cm$^{-3}$ to $2\times10^{16}$ cm$^{-3}$. The thermal operation for the PMOS threshold adjustment region 114 may be the thermal operation used for the NMOS drain extension 144 and the NMOS source extension 146.

The integrated circuit 100 also includes a first PMOS transistor 170 and a first NMOS transistor 172 which operate in a low voltage range, for example less than 3 volts, and a second PMOS transistor 174 and a second NMOS transistor 176 which operate in a mid voltage range, for example 3 to 5 volts. Elements of the first PMOS transistor 170, the first NMOS transistor 172, the second PMOS transistor 174 and the second NMOS transistor 176 are formed subsequent to processes described in reference to FIG. 2A and FIG. 2B.

Figure 3A:
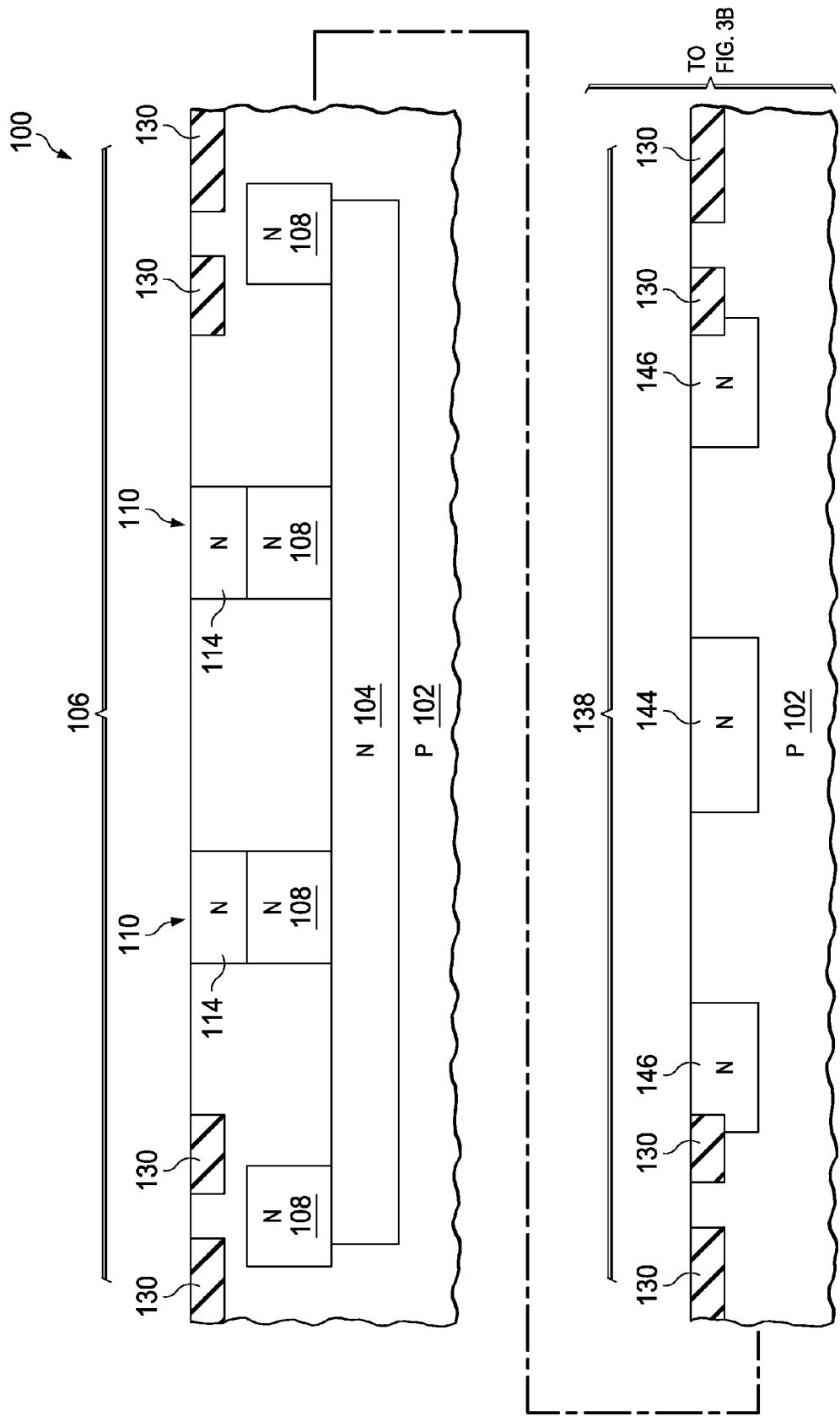
Figure 3B:
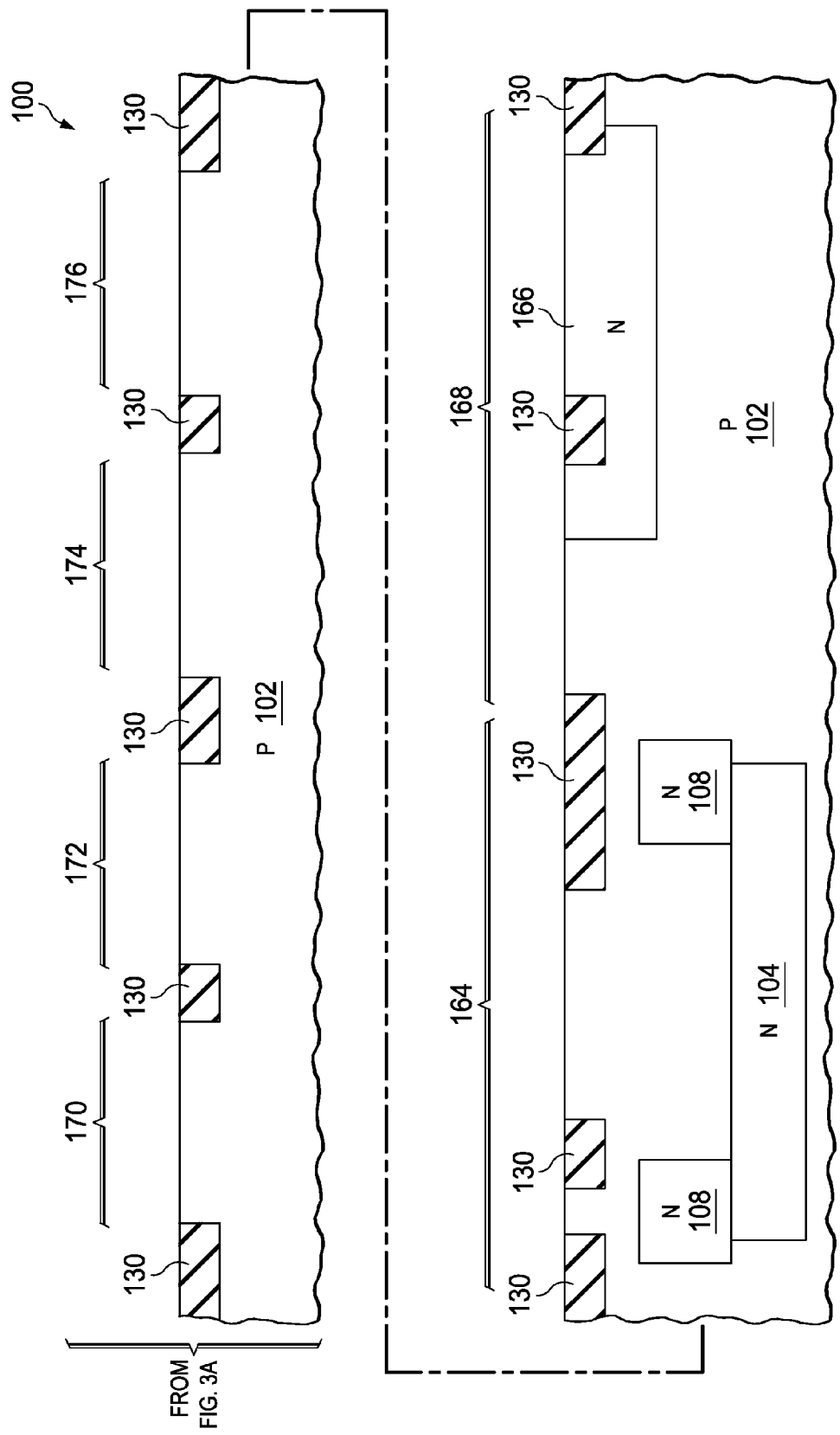

Referring to FIG. 3A and FIG. 3B, the field oxide 130 is formed at the top surface of the substrate 102. The field oxide 130 surrounds the p-channel high-voltage MOS transistor 106 and surrounds the n-channel high-voltage MOS transistor 138. The field oxide 130 laterally isolates the first PMOS transistor 170, the first NMOS transistor 172, the second PMOS transistor 174, the second NMOS transistor 176, the isolated NMOS transistor 164 and the extended-drain NMOS transistor 168. Field oxide 130 may also be formed in the drain extension 166 of the extended-drain NMOS transistor 168 as depicted in FIG. 3B.

Figure 4A:
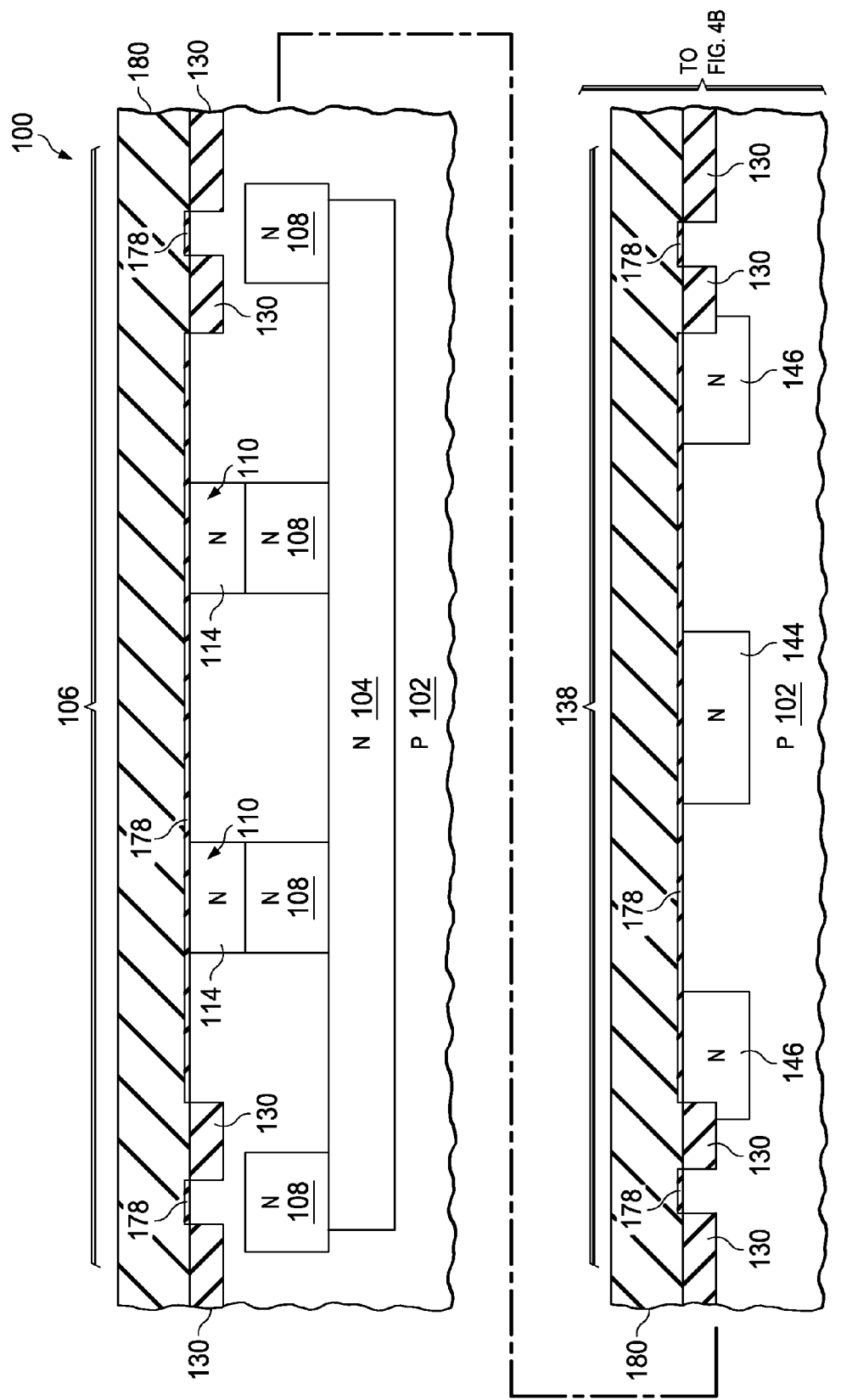
Figure 4B:
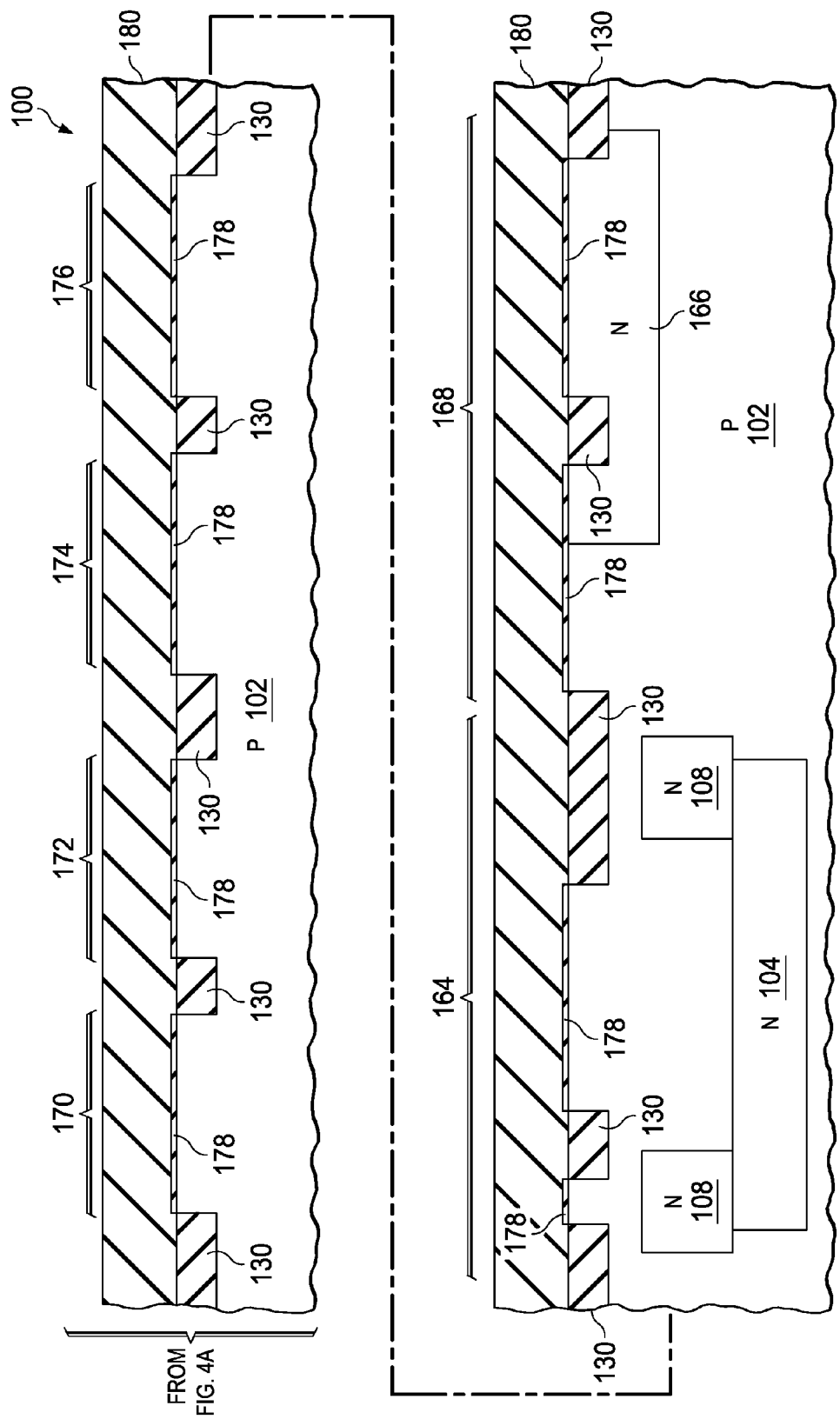

Referring to FIG. 4A and FIG. 4B, a layer of dummy oxide 178 is formed on at least exposed semiconductor material at the top surface of the substrate 102. The dummy oxide 178 may be, for example, 5 to 30 nanometers thick, and include silicon dioxide. The dummy oxide 178 may be formed, for example, by thermal oxidation of the exposed semiconductor material at the top surface of the substrate 102, or may be formed, for another example, by decomposition of tetraethyl orthosilicate, also known as tetraethoxysilane or TEOS.

A layer of silicon nitride 180 is formed over the dummy oxide 178. The silicon nitride layer 180 may be, for example, 60 to 100 nanometers thick and may be formed by low pressure chemical vapor deposition (LPCVD) using ammonia and silane or dichlorosilane at 700 C to 800 C, decomposition of bis (tertiary-butylamino) silane (BTBAS) at 550 C to 600 C, or plasma enhanced chemical vapor deposition (PECVD). Forming the silicon nitride layer 180 by another process is within the scope of the instant embodiment.

Figure 5A:
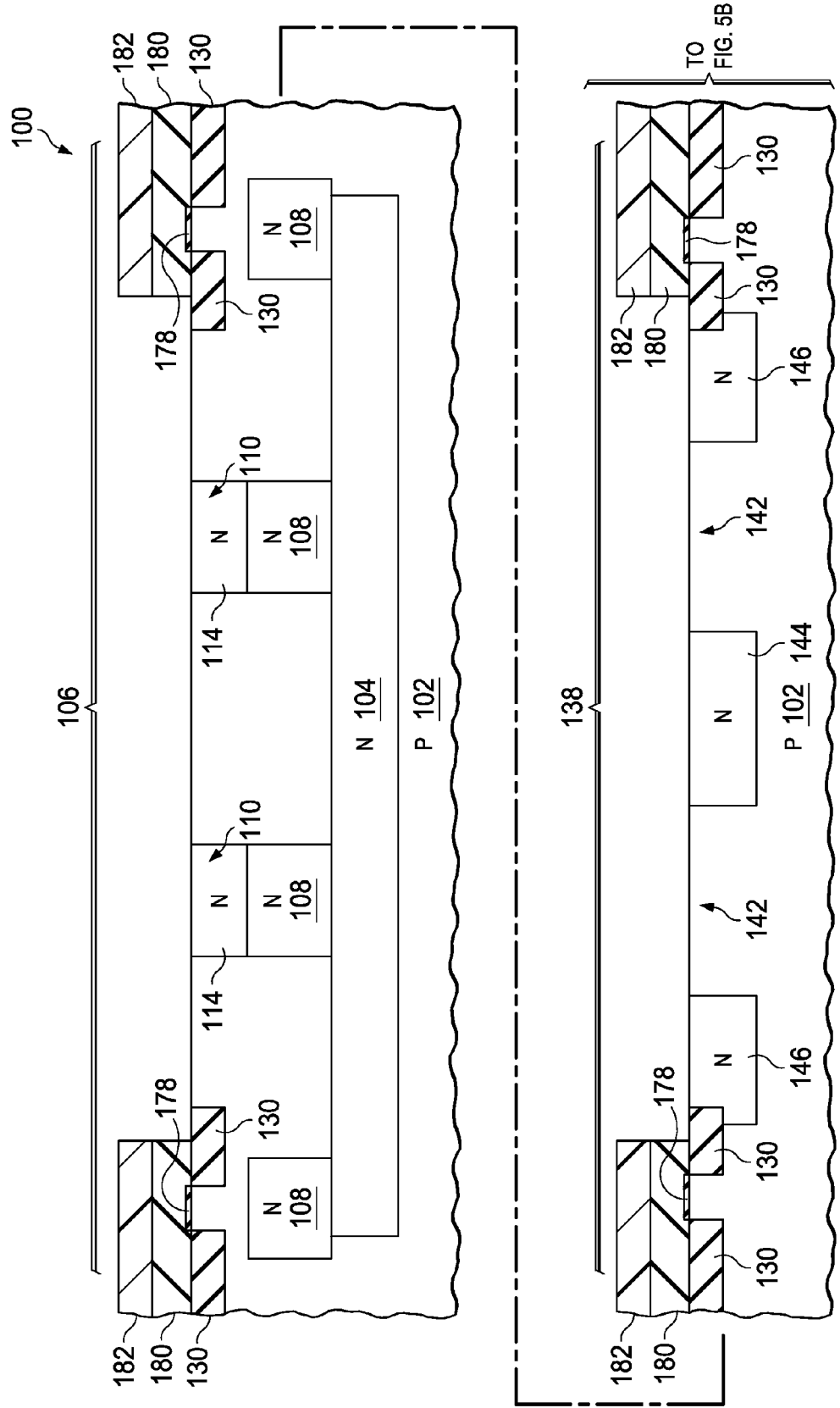
Figure 5B:
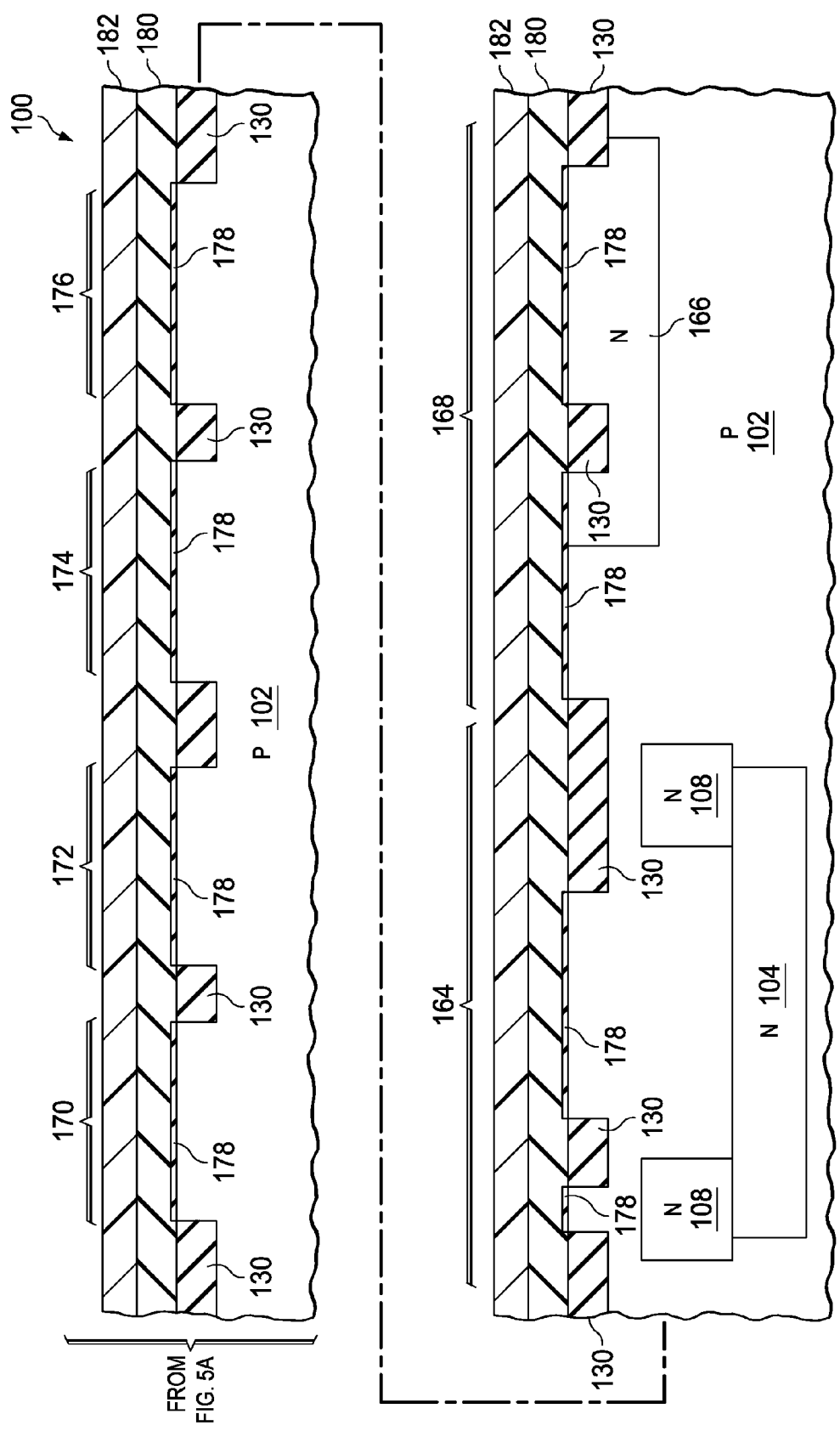

Referring to FIG. 5A and FIG. 5B, a high-voltage gate oxide etch mask 182 is formed over the silicon nitride layer, so as to expose the PMOS channel area 110 in the p-channel high-voltage MOS transistor 106 and to expose the NMOS channel area 142 in the n-channel high-voltage MOS transistor 138, while covering the isolated NMOS transistor 164, the extended-drain NMOS transistor 168, the first PMOS transistor 170, the first NMOS transistor 172, the second PMOS transistor 174 and the second NMOS transistor 176. The high-voltage gate oxide etch mask 182 may be formed, for example, of photoresist by photolithographic processes. A silicon nitride etch process is performed which removes the silicon nitride layer 180 in the exposed area. The silicon nitride etch process may be, for example, a reactive ion etch (RIE) process which uses fluorine radicals to etch the silicon nitride. Subsequent to removing the silicon nitride, a dummy oxide etch process is performed which removes the dummy oxide layer 178 in the exposed area. The dummy oxide etch process may be, for example a wet etch process using an aqueous buffered solution of dilute hydrofluoric acid. After the dummy oxide etch process is completed, the high-voltage gate oxide etch mask 182 is removed, for example by exposing the integrated circuit 100 to an oxygen containing plasma, followed by a wet cleanup to remove any organic residue.

Figure 6A:
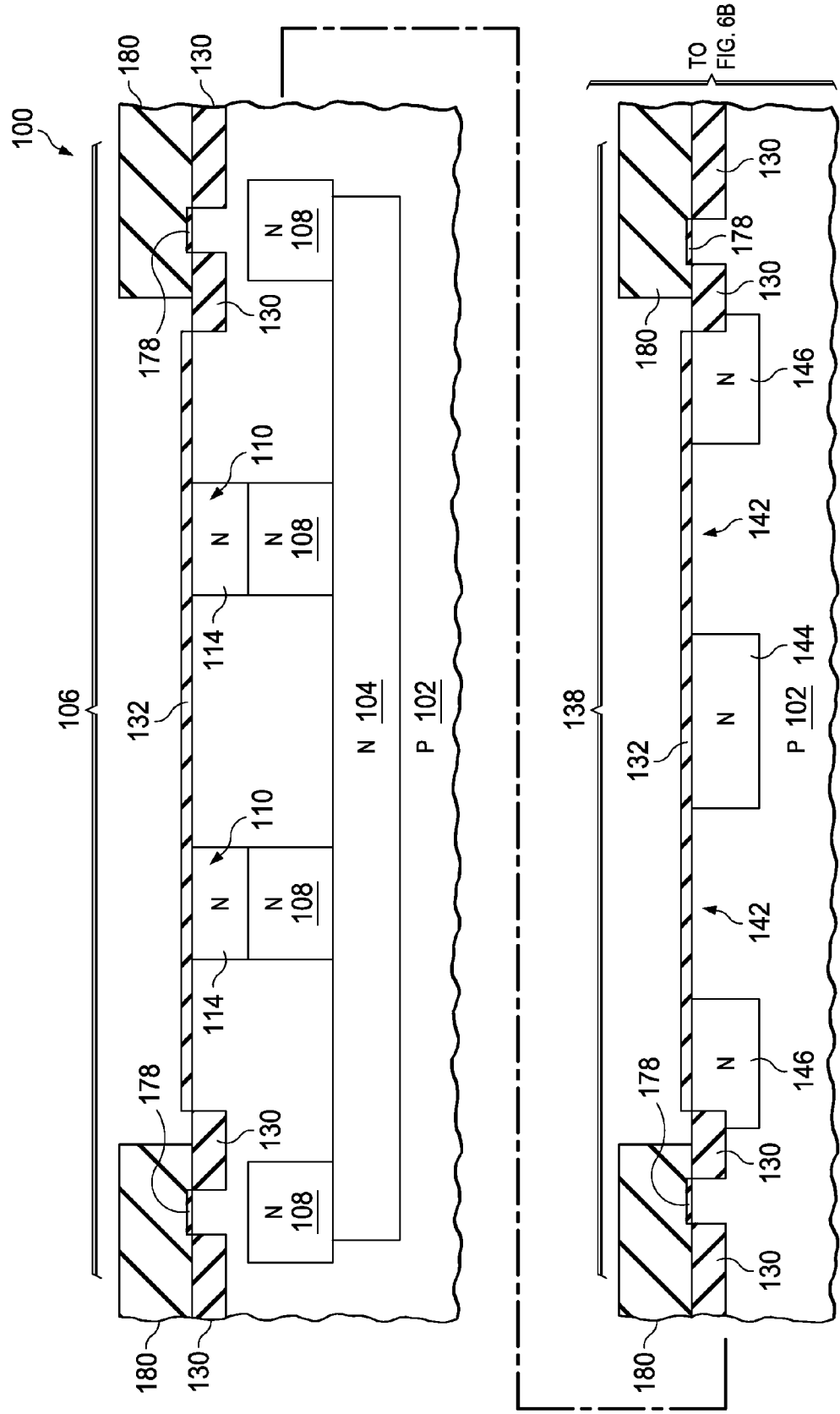
Figure 6B:
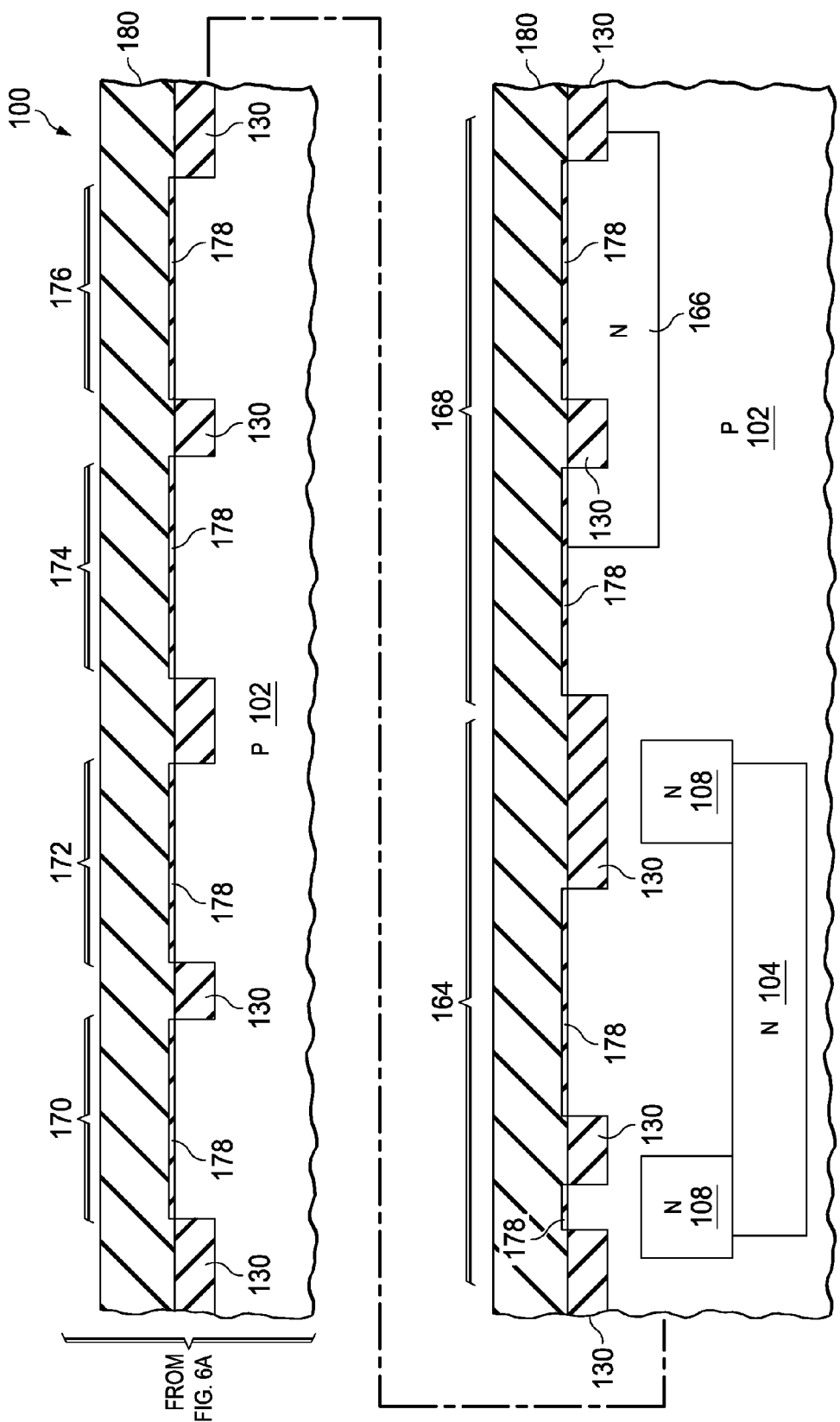

Referring to FIG. 6A and FIG. 6B, the high-voltage gate dielectric layer 132 is formed at the top surface of the substrate 102 in the area exposed by the silicon nitride layer 180 in at least the p-channel high-voltage MOS transistor 106 and the re-channel high-voltage MOS transistor 138. The high-voltage gate dielectric layer 132 may be formed, for example, by a process of thermal silicon dioxide growth at 950 C to 1050 C in an ambient gas containing 10 percent to 100 percent oxygen. The thermally grown silicon dioxide may subsequently be exposed to nitrogen radicals from a nitrogen-containing plasma so as to incorporate nitrogen into the high-voltage gate dielectric layer 132. The high-voltage gate dielectric layer 132 may also include high-k dielectric materials such as tantalum oxide, hafnium oxide or zirconium oxide. An as-grown thickness of the high-voltage gate dielectric layer 132 will be thicker than a final desired thickness, due to loss of material from the high-voltage gate dielectric layer 132 during subsequent etch processes. After the high-voltage gate dielectric layer 132 is formed, the silicon nitride layer 180 is removed, for example using a wet etch process with phosphoric acid.

Figure 7A:
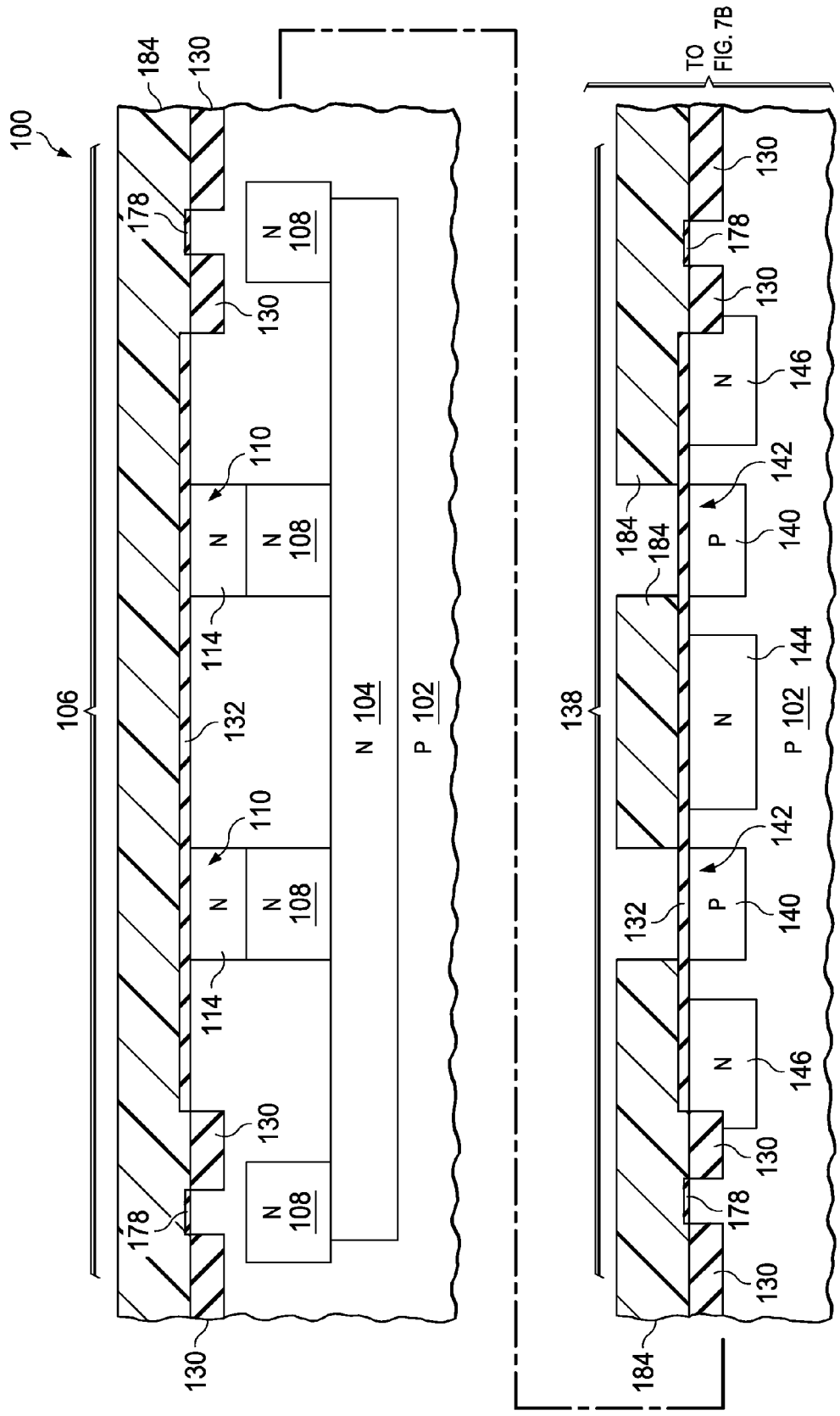
Figure 7B:
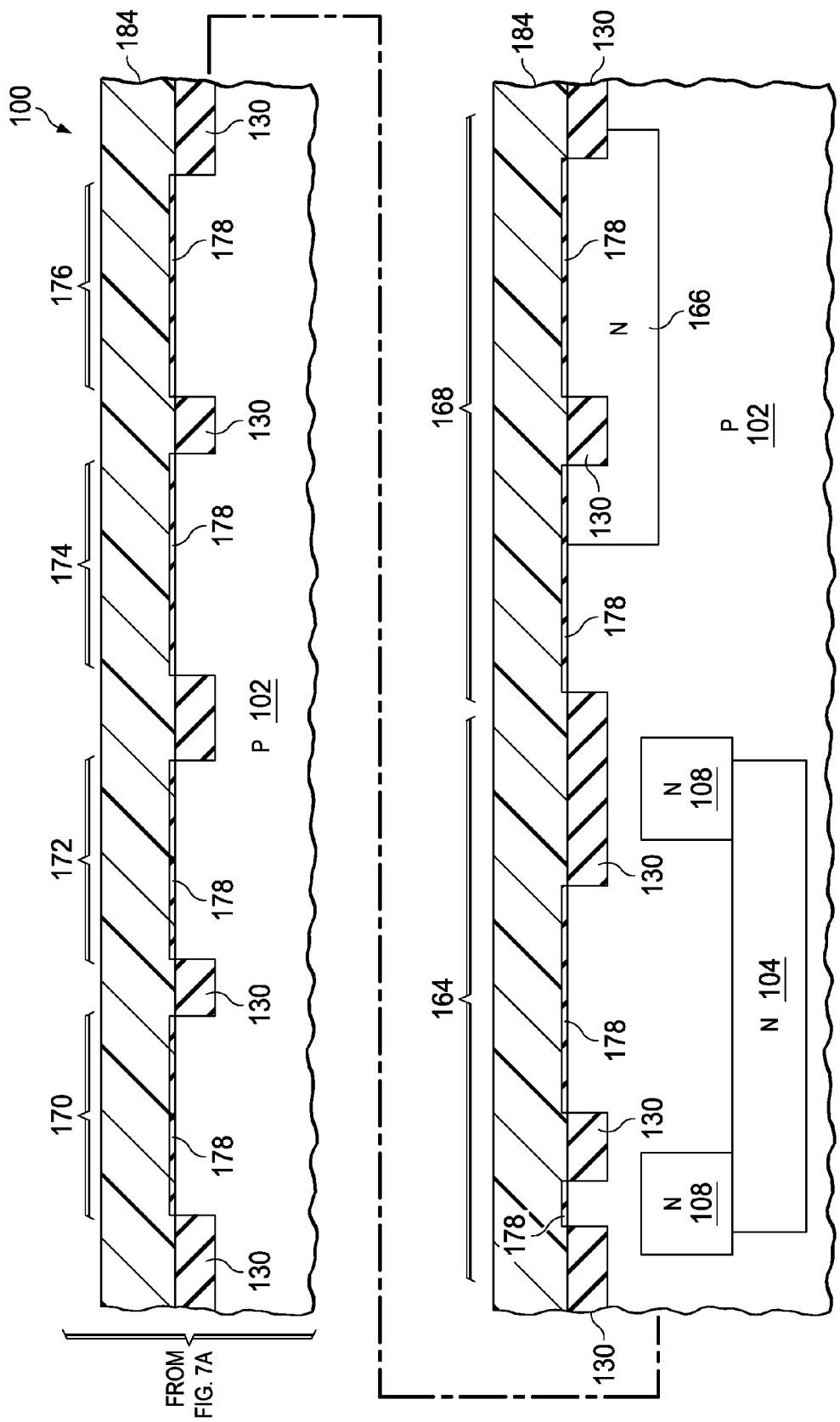

Referring to FIG. 7A and FIG. 7B, an optional NMOS threshold adjustment implant mask 184 may be formed over the integrated circuit 100 so as to expose the NMOS channel area 142. An NMOS threshold adjustment implant process is performed which implant p-type dopants into the substrate 102 in the NMOS channel area 142 to form the p-type NMOS threshold adjustment region 140 which extends to the top surface of the substrate 102. The NMOS threshold adjustment implant mask 184, if formed, is removed after the NMOS threshold adjustment implant process is completed. In an alternate version of the instant embodiment, the NMOS threshold adjustment implant mask 184 is not formed and the NMOS threshold adjustment implant process is a blanket implant process. The NMOS threshold adjustment implant process may include, for example, implanting boron in two steps with a first dose of $1 \times 10^{11}$ cm$^{-2}$ to $5 \times 10^{11}$ cm$^{-2}$ at an energy of 35 to 65 keV and a second dose of $3 \times 10^{11}$ cm$^{-2}$ to $7 \times 10^{11}$ cm$^{-2}$ at an energy of 325 to 425 keV, followed by a subsequent thermal process to diffuse and activate the boron.

Figure 8A:
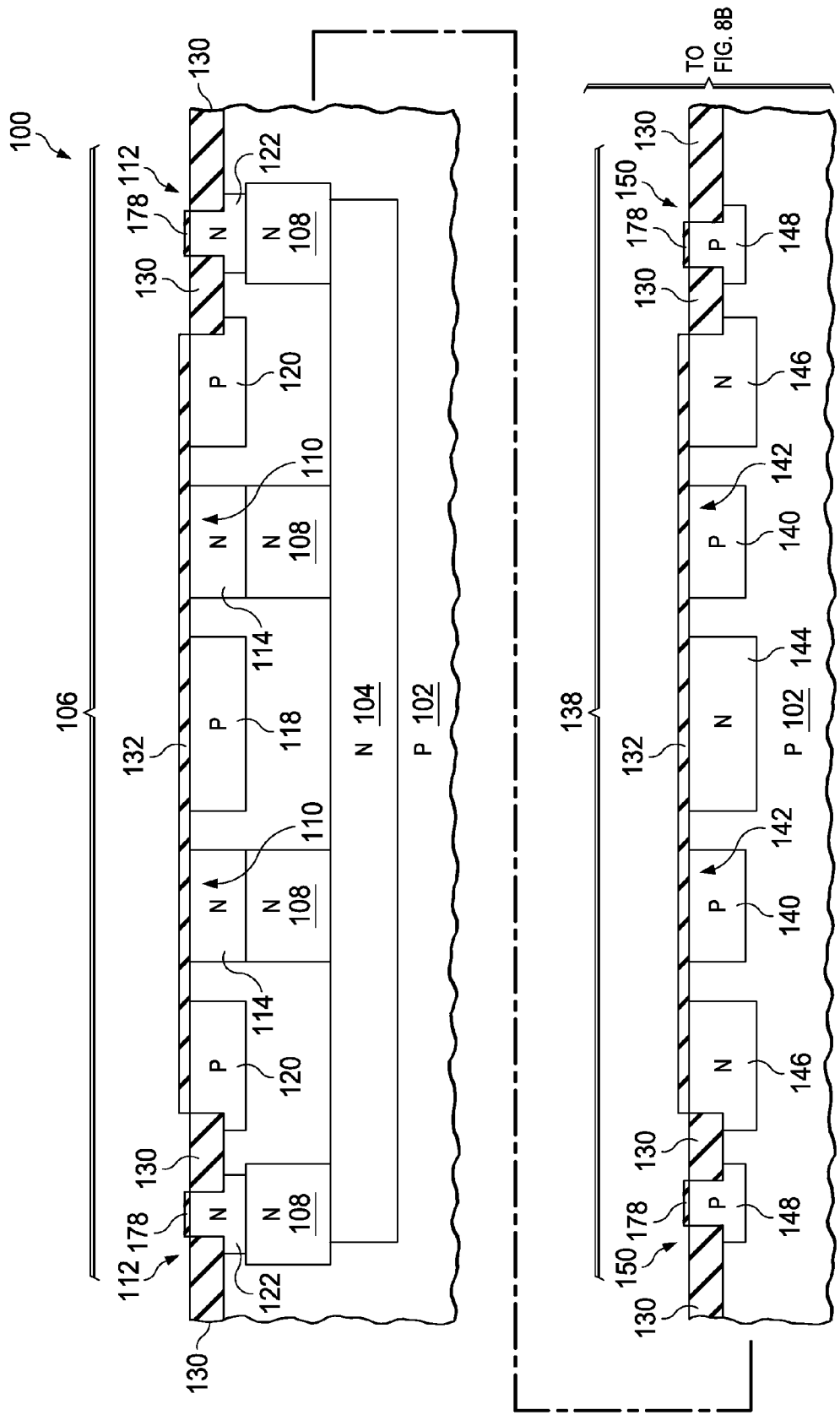
Figure 8B:
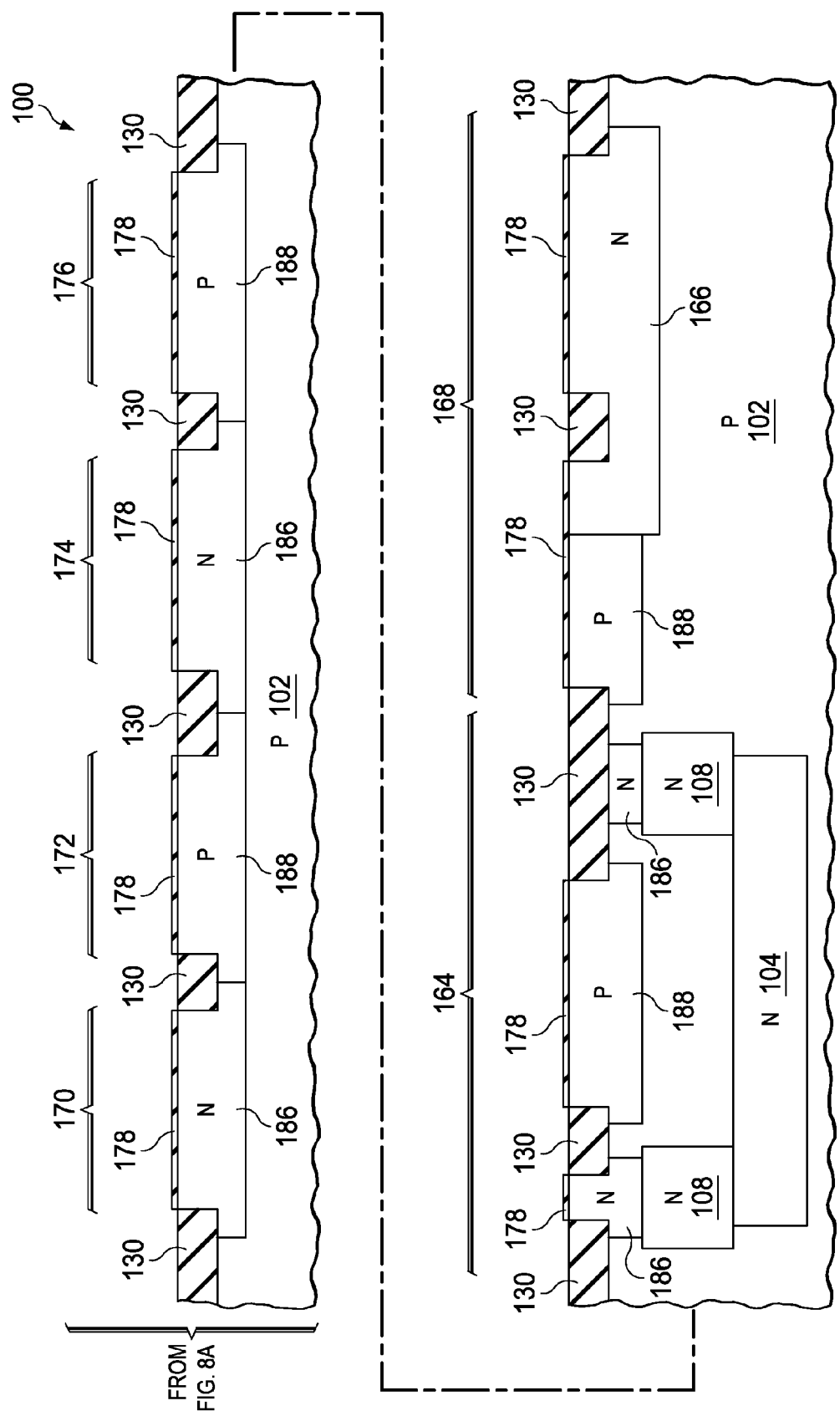

Referring to FIG. 8A and FIG. 8B, a shallow n-type well implant process is performed which implants n-type dopants into the substrate 102 to form the body links 122 in the in the PMOS body contact areas 112 of the p-channel high-voltage MOS transistor 106, and concurrently form shallow n-wells 186 under the first PMOS transistor 170 and the second PMOS transistor 174 and isolation connection wells 186 in the isolated NMOS transistor 164. The shallow n-type well implant process may include, for example, implanting phosphorus in several steps, such as a first dose of $2 \times 10^{12}$ cm$^{-2}$ to $6 \times 10^{12}$ cm$^{-2}$ at an energy of 100 to 180 keV, a second dose of $2 \times 10^{12}$ cm$^{-2}$ to $6 \times 10^{12}$ cm$^{-2}$ at an energy of 250 to 400 keV, and a third dose of $2 \times 10^{13}$ cm$^{-2}$ to $6 \times 10^{13}$ cm$^{-2}$ at an energy of 500 to 800 keV.

A shallow p-type well implant process is performed which implants p-type dopants into the substrate 102 to form the PMOS drain extension 118 and the PMOS source extension 120 of the p-channel high-voltage MOS transistor 106 and form the NMOS body contact extensions 148 in the NMOS body contact areas 150 of the re-channel high-voltage MOS transistor 138, and concurrently form shallow p-wells 188 under the first NMOS transistor 172, the second NMOS transistor 176, the isolated NMOS transistor 164 and the extended-drain NMOS transistor 168. The shallow p-type well implant process may include, for example, implanting boron in several steps, such as a first dose of $5 \times 10^{12}$ cm$^{-2}$ to $1 \times 10^{13}$ cm$^{-2}$ at an energy of 50 to 100 keV, a second dose of $5 \times 10^{12}$ cm$^{-2}$ to $1.2 \times 10^{13}$ cm$^{-2}$ at an energy of 120 to 160 keV, and a third dose of $2 \times 10^{13}$ cm$^{-2}$ to $6 \times 10^{13}$ cm$^{-2}$ at an energy of 250 to 500 keV.

Figure 9A:
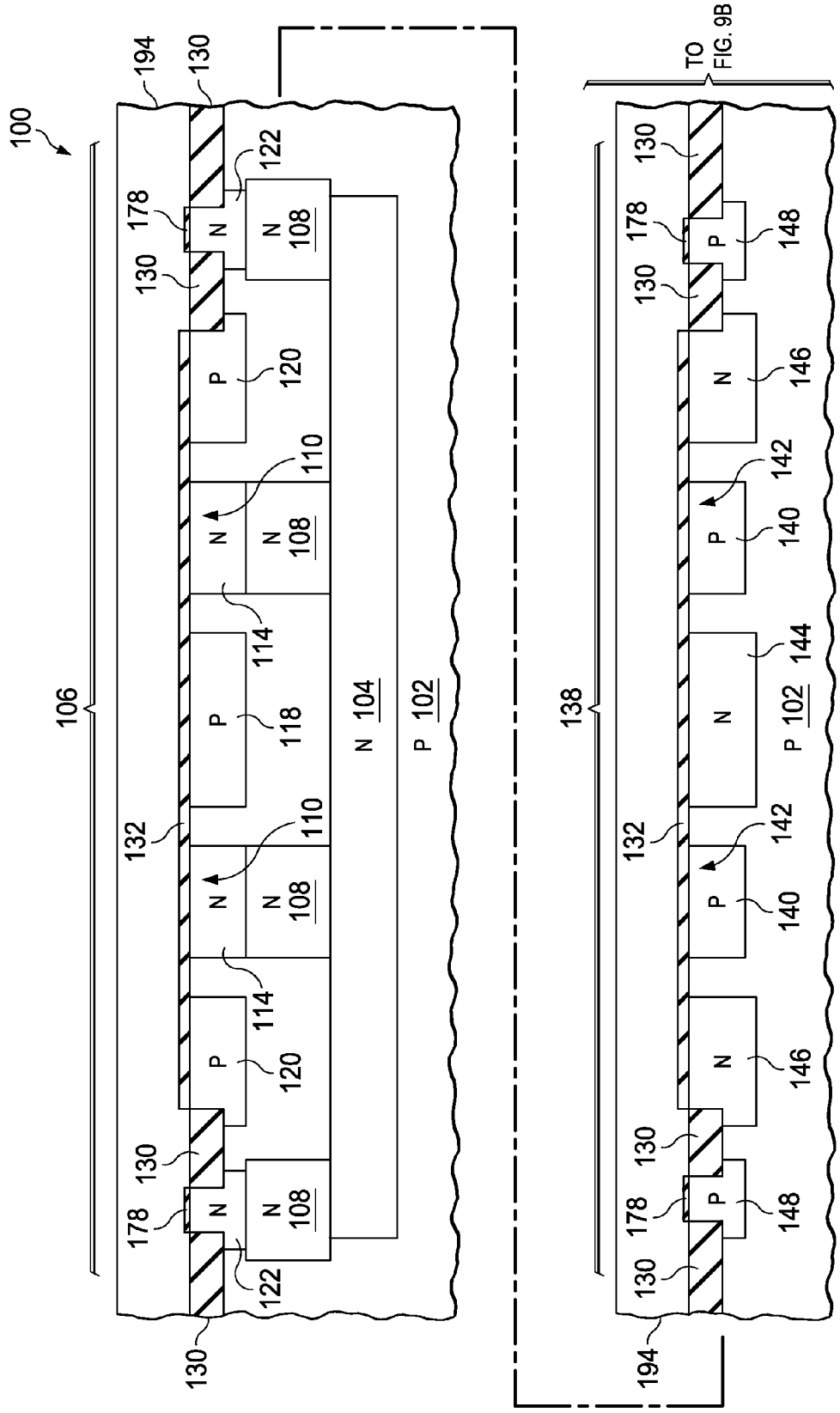
Figure 9B:
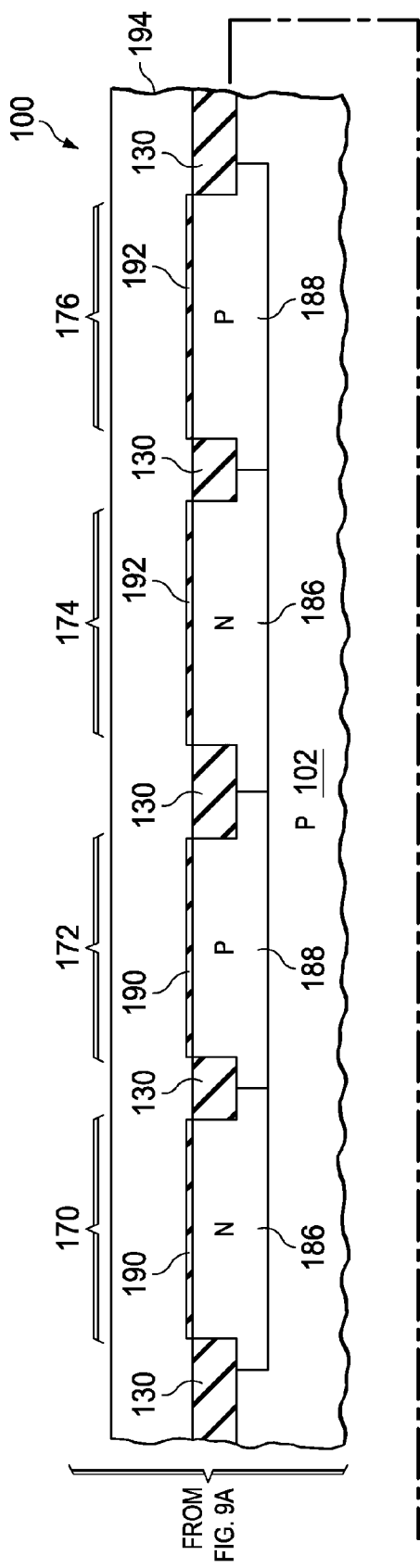
Figure 9B:
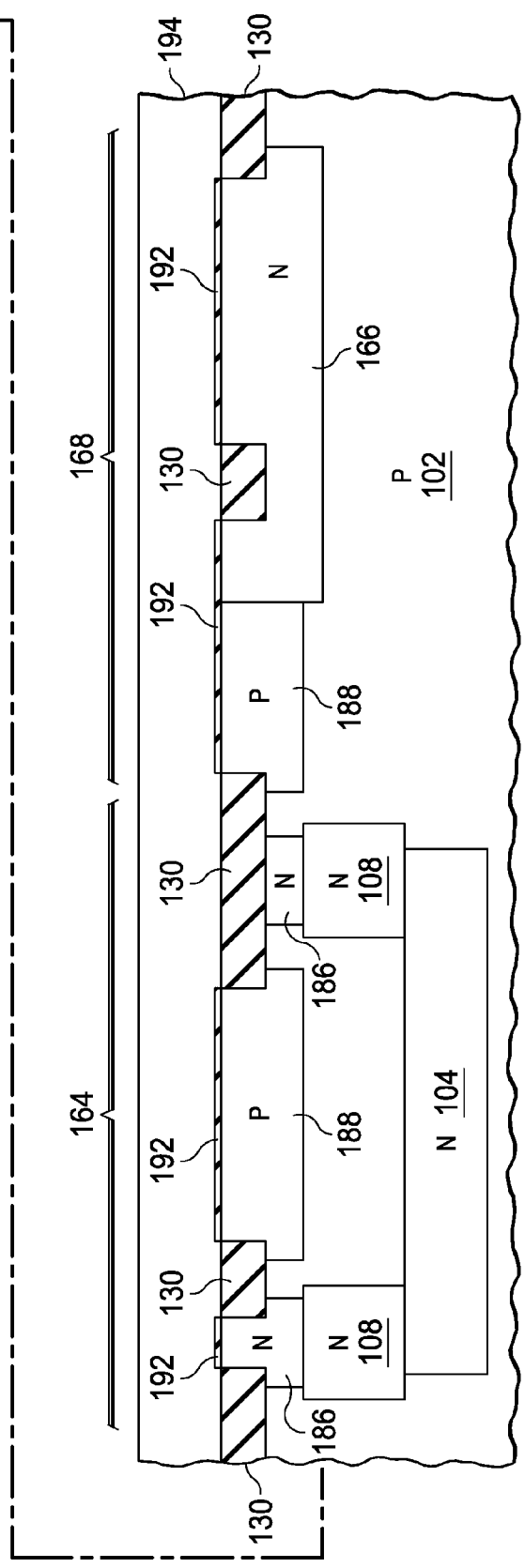

Referring to FIG. 9A and FIG. 9B, a first gate dielectric layer 190 is formed at the top surface of the substrate 102 in the first PMOS transistor 170 and the first NMOS transistor 172. The first gate dielectric layer 190 may be, for example, one or more layers of silicon dioxide, silicon oxy-nitride, aluminum oxide, aluminum oxy-nitride, hafnium oxide, hafnium silicate, hafnium silicon oxy-nitride, zirconium oxide, zirconium silicate, zirconium silicon oxy-nitride, a combination of the aforementioned materials, or other insulating material. The first gate dielectric layer 190 may include nitrogen as a result of exposure to a nitrogen containing plasma or a nitrogen-containing ambient gas at temperatures from 50 C to 800 C. The first gate dielectric layer 190 may be 1.5 to 7 nanometers thick to provide operation of the first PMOS transistor 170 and the first NMOS transistor 172 in a low voltage range of less than 3 volts. The first gate dielectric layer 190 may be formed by any of a variety of gate dielectric formation processes, for example thermal oxidation, plasma nitridation of an oxide layer, and/or dielectric material deposition by atomic layer deposition (ALD).

A second gate dielectric layer 192 is formed at the top surface of the substrate 102 in the second PMOS transistor 174, the second NMOS transistor 176, the isolated NMOS transistor 164 and the extended-drain NMOS transistor 168. The second gate dielectric layer 192 may include, for example, thermally grown silicon dioxide, and be 8.5 and 15 nanometers thick, to provide operation of the second PMOS transistor 174, the second NMOS transistor 176 and the isolated NMOS transistor 164 in a mid voltage range of 3 to 5 volts.

The first gate dielectric layer 190 and the second gate dielectric layer 192 may be formed, for example, using a process sequence including: forming a first etch mask of photoresist over the integrated circuit 100 which exposes at least areas for the second gate dielectric layer 192 and masks the high-voltage gate dielectric layer 132, removing the dummy oxide layer 178 in the exposed areas using a wet etch of dilute hydrofluoric acid, removing the first etch mask, growing the second gate dielectric layer 192 using a thermal oxidation process, forming a second etch mask of photoresist over the integrated circuit 100 which exposes areas for the first gate dielectric layer 190 and masks the second gate dielectric layer 192 and the high-voltage gate dielectric layer 132, removing oxide in the exposed areas using a wet etch of dilute hydrofluoric acid, removing the second etch mask, and growing the first gate dielectric layer 190 using a thermal oxidation process.

A gate layer 194 is formed on the integrated circuit 100, covering the first gate dielectric layer 190, the second gate dielectric layer 192 and the high-voltage gate dielectric layer 132. The gate layer 194 may be, for example, polysilicon with a thickness of 400 to 800 nanometers. The gate layer 194 may be doped to provide a desired work function.

Figure 10A:
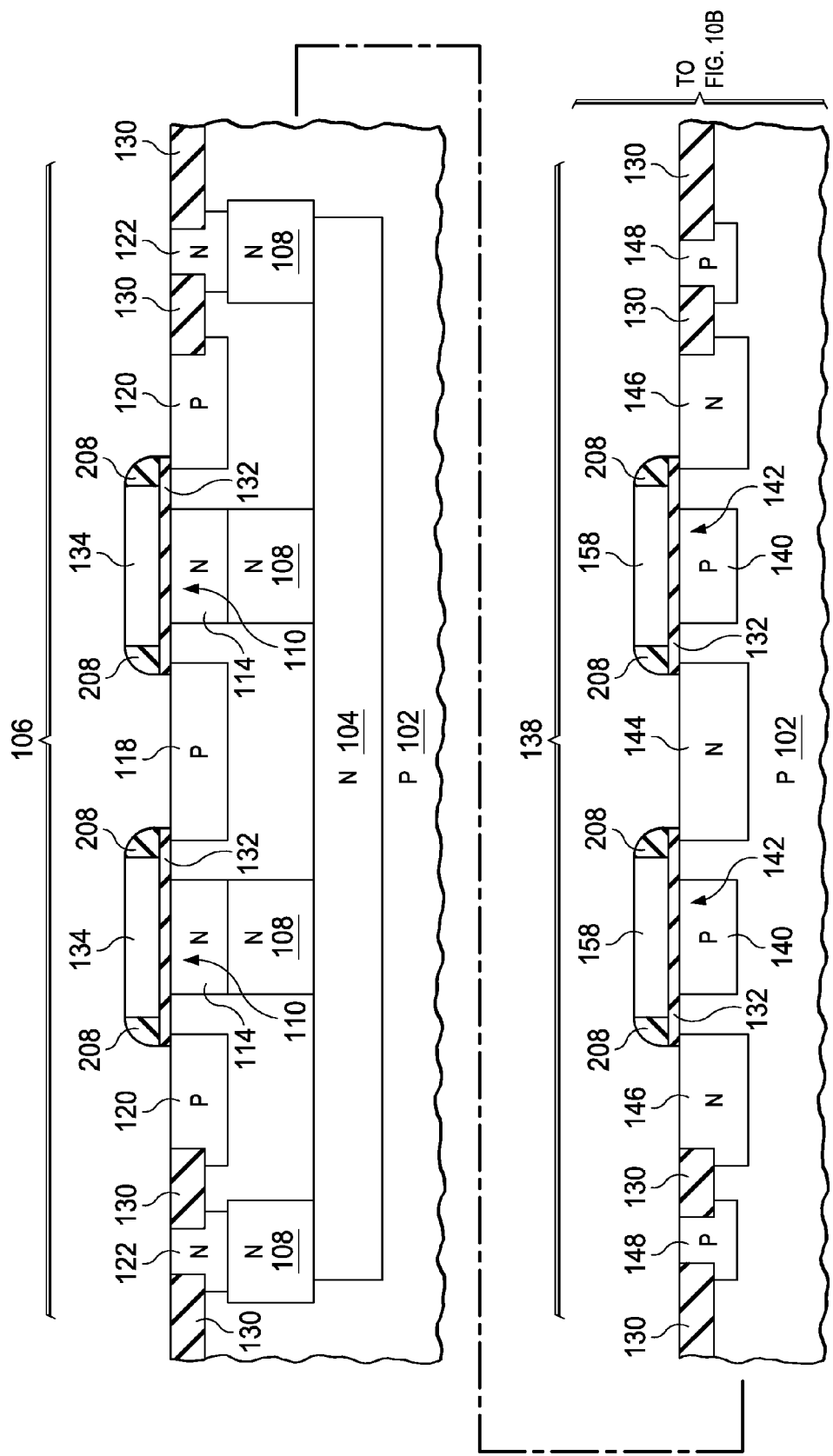
Figure 10B:
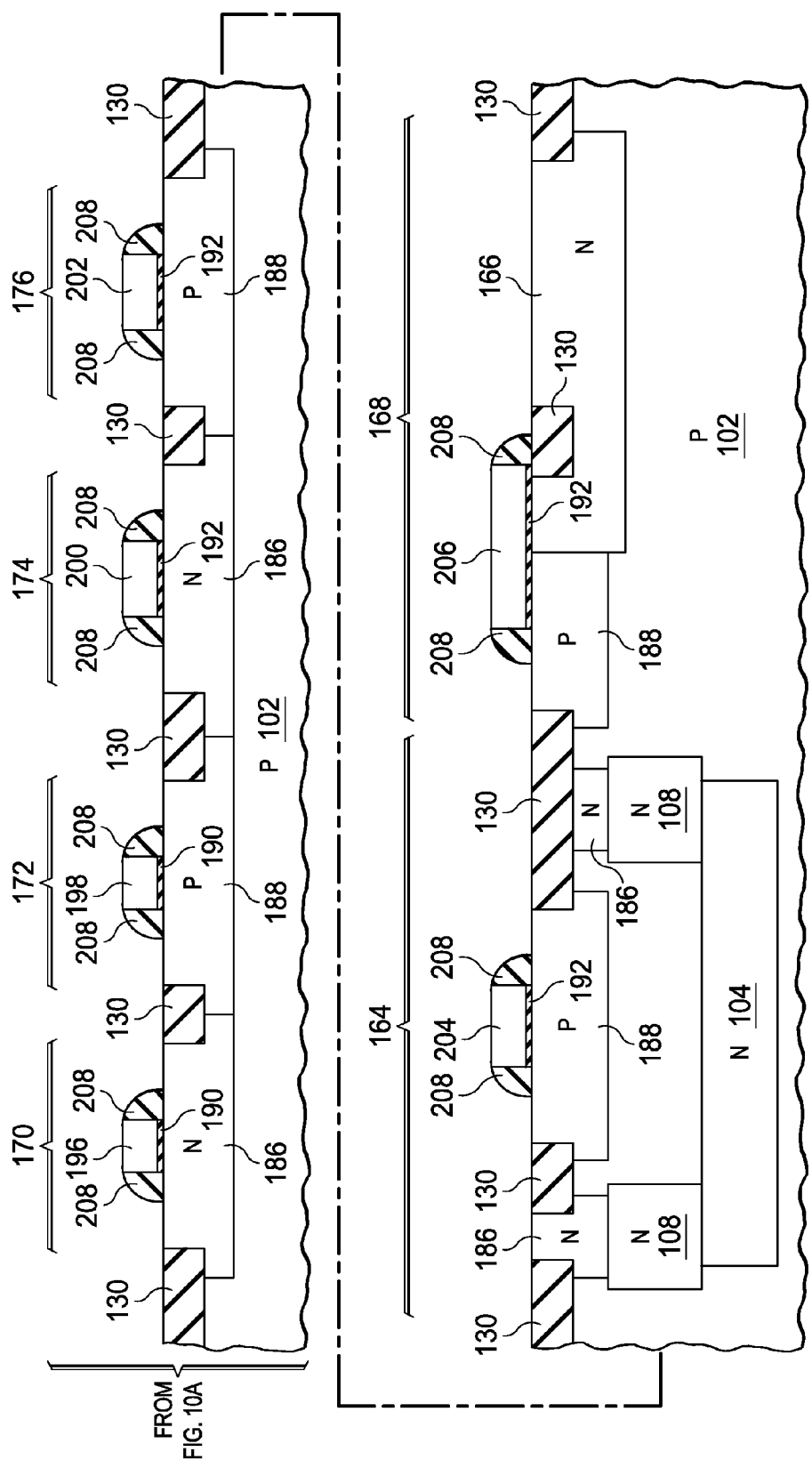

Referring to FIG. 10A and FIG. 10B, the gate layer 194 is patterned to form the high-voltage PMOS gate 134 over the PMOS channel area 110, the high-voltage NMOS gate 158 over the NMOS channel area 142, and to form a first PMOS gate 196 on the first gate dielectric layer 190 in the first PMOS transistor 170, a first NMOS gate 198 on the first gate dielectric layer 190 in the first NMOS transistor 172, a second PMOS gate 200 on the second gate dielectric layer 192 in the second PMOS transistor 174, a second NMOS gate 202 on the second gate dielectric layer 192 in the second NMOS transistor 176, an isolated NMOS gate 204 on the second gate dielectric layer 192 in the isolated NMOS transistor 164 and an extended-drain NMOS gate 206 on the second gate dielectric layer 192 in the extended-drain NMOS transistor 168.

In one version of the instant embodiment, the high-voltage PMOS gate 134, the high-voltage NMOS gate 158, the first PMOS gate 196, the first NMOS gate 198, the second PMOS gate 200, the second NMOS gate 202, the isolated NMOS gate 204 and the extended-drain NMOS gate 206 may be formed by forming a gate etch mask of photoresist over the gate layer 194 and subsequently removing unwanted material from the gate layer 194 by an RIE process. In another version of the instant embodiment, a hard mask layer may be formed over the gate layer 194 followed by a photoresist layer and an anti-reflection layer. The photoresist layer may be patterned with a desired size offset and material may be removed from the hard mask layer using the patterned photoresist layer as an etch mask to provide a hard mask gate etch mask. Unwanted material may be subsequently removed from the gate layer 194 using an RIE process.

Optional gate sidewall spacers 208 may be formed laterally adjacent to the high-voltage PMOS gate 134, the high-voltage NMOS gate 158, the first PMOS gate 196, the first NMOS gate 198, the second PMOS gate 200, the second NMOS gate 202, the isolated NMOS gate 204 and the extended-drain NMOS gate 206. The gate sidewall spacers 208 may include, for example, of one or more layers of silicon nitride and/or silicon dioxide. The gate sidewall spacers 208 may be formed, for example, by forming one or more conformal layers of spacer material, such as silicon nitride by LPCVD, PECVD or decomposition of BTBAS, and/or silicon dioxide by decomposition of TEOS. Unwanted material in the conformal layers may be subsequently removed using an anisotropic etch leaving the gate sidewall spacers 208 on vertical surfaces such as lateral surfaces of the gates 134, 158, 196, 198, 200, 202, 204 and 206.

P-type lightly doped drain regions, not shown in FIG. 10A and FIG. 10B, may be formed in the substrate 102 adjacent to the first PMOS gate 196 in the first PMOS transistor 170 and adjacent to the second PMOS gate 200 in the second PMOS transistor 174, after formation of the first PMOS gate 196 and second PMOS gate 200, respectively, and prior to formation of the gate sidewall spacers 208. Similarly, n-type lightly doped drain regions, not shown in FIG. 10A and FIG. 10B, may be formed in the substrate 102 adjacent to the first NMOS gate 198 in the first NMOS transistor 172, adjacent to the second NMOS gate 202 in the second NMOS transistor 176, and adjacent to the isolated NMOS gate 204 in the isolated NMOS transistor 164, after formation of the first NMOS gate 198, the second NMOS gate 202 and the isolated NMOS gate 204, respectively, and prior to formation of the gate sidewall spacers 208.

Figure 11A:
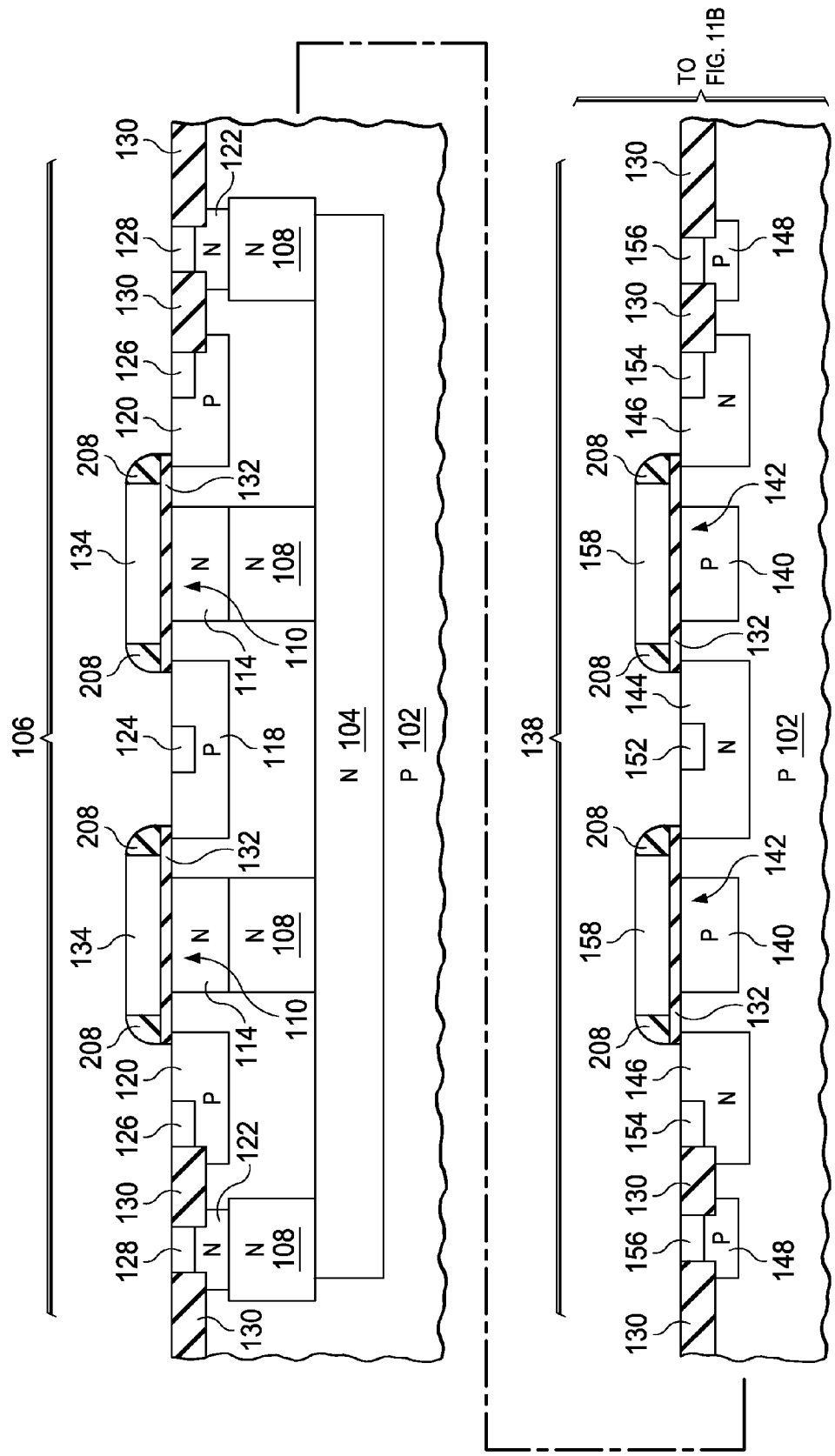
Figure 11B:
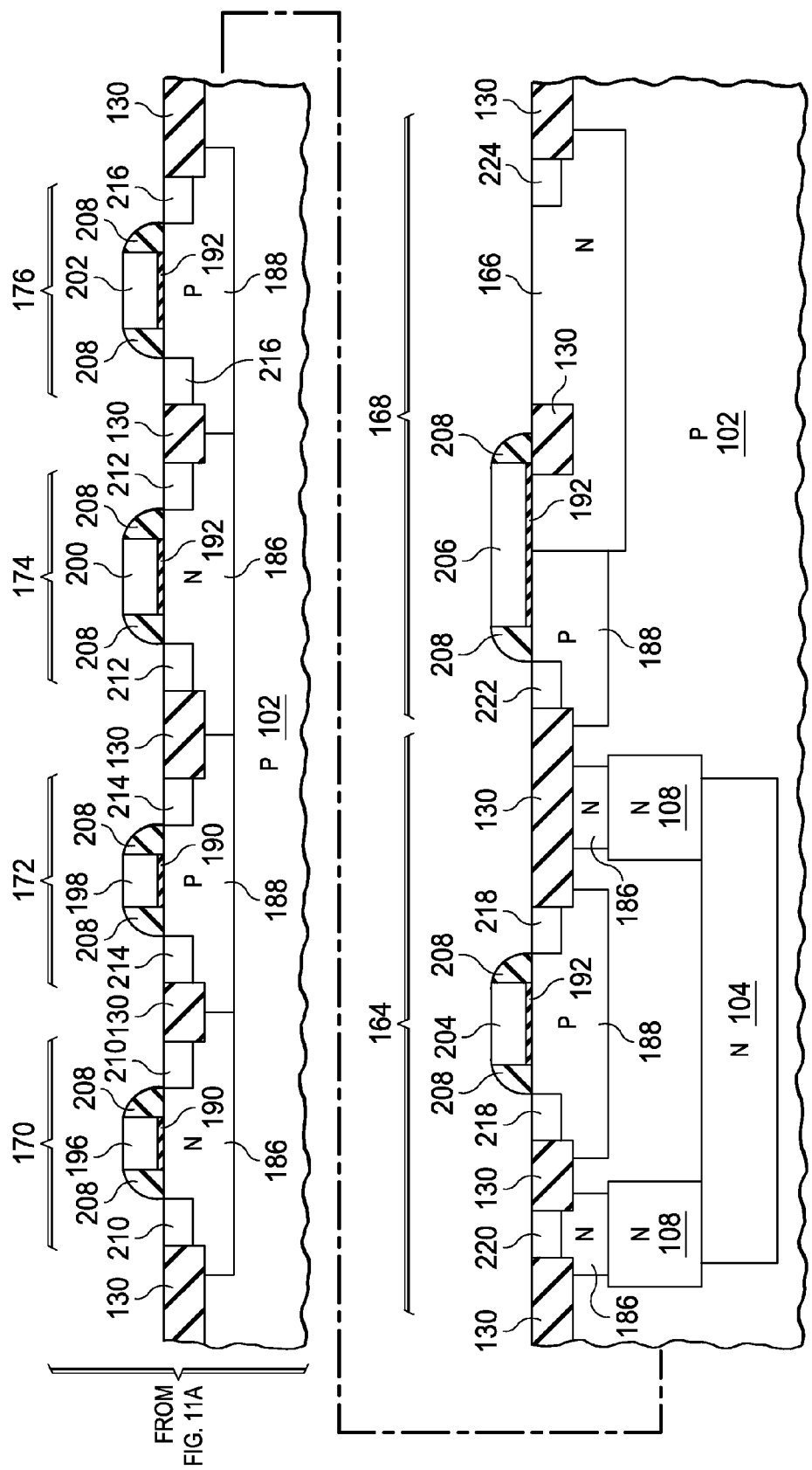

Referring to FIG. 11A and FIG. 11B, a p-type source/drain (PSD) implant process is performed which implants p-type dopants into the substrate 102 to form the p-type PMOS drain contact region 124, the p-type PMOS source contact region 126, and the p-type NMOS body contact regions 156 concurrently with p-type first PSD regions 210 and p-type second PSD regions 212. The first PSD regions 210 are formed in the substrate 102 adjacent to the first PMOS gate 196 in the first PMOS transistor 170. The second PSD regions 212 are formed in the substrate 102 adjacent to the second PMOS gate 200 in the second PMOS transistor 174. The PSD implant process may include, for example, implanting boron with a dose of $1 \times 10^{15}$ cm$^{-2}$ to $5 \times 10^{15}$ cm$^{-2}$ at an energy of 5 to 15 keV.

An n-type source/drain (NSD) implant process is performed which implants n-type dopants into the substrate 102 to form the n-type PMOS body contact regions 128, the n-type NMOS drain contact region 152 and the n-type NMOS source contact region 154 concurrently with n-type first NSD regions 214, n-type second NSD regions 216, n-type isolated NSD regions 218, n-type isolation contact region 220, n-type extended-drain source region 222 and n-type extended-drain drain contact region 224. The first NSD regions 214 are formed in the substrate 102 adjacent to the first NMOS gate 198 in the first NMOS transistor 172. The second NSD regions 216 are formed in the substrate 102 adjacent to the second NMOS gate 202 in the second NMOS transistor 176. The isolated NSD regions 218 are formed in the substrate 102 adjacent to the isolated NMOS gate 204 in the isolated NMOS transistor 164. The isolation contact region 220 is formed in the substrate 102 in at least one of the isolation connection wells 186 in the isolated NMOS transistor 164. The extended-drain source region 222 is formed in the substrate 102 in the shallow p-well 188 adjacent to the extended-drain NMOS gate 206 in the extended-drain NMOS transistor 168. The extended-drain drain contact region 224 is formed in the substrate 102 in the drain extension 166 opposite from the extended-drain NMOS gate 206 in the extended-drain NMOS transistor 168. The NSD implant process may include, for example, implanting arsenic with a dose of $1 \times 10^{15}$ cm$^{-2}$ to $5 \times 10^{15}$ cm$^{-2}$ at an energy of 30 to 60 keV and implanting phosphorus with a dose of $1 \times 10^{14}$ cm$^{-2}$ to $1 \times 10^{15}$ cm$^{-2}$ at an energy of 50 to 80 keV.

Figure 12A:
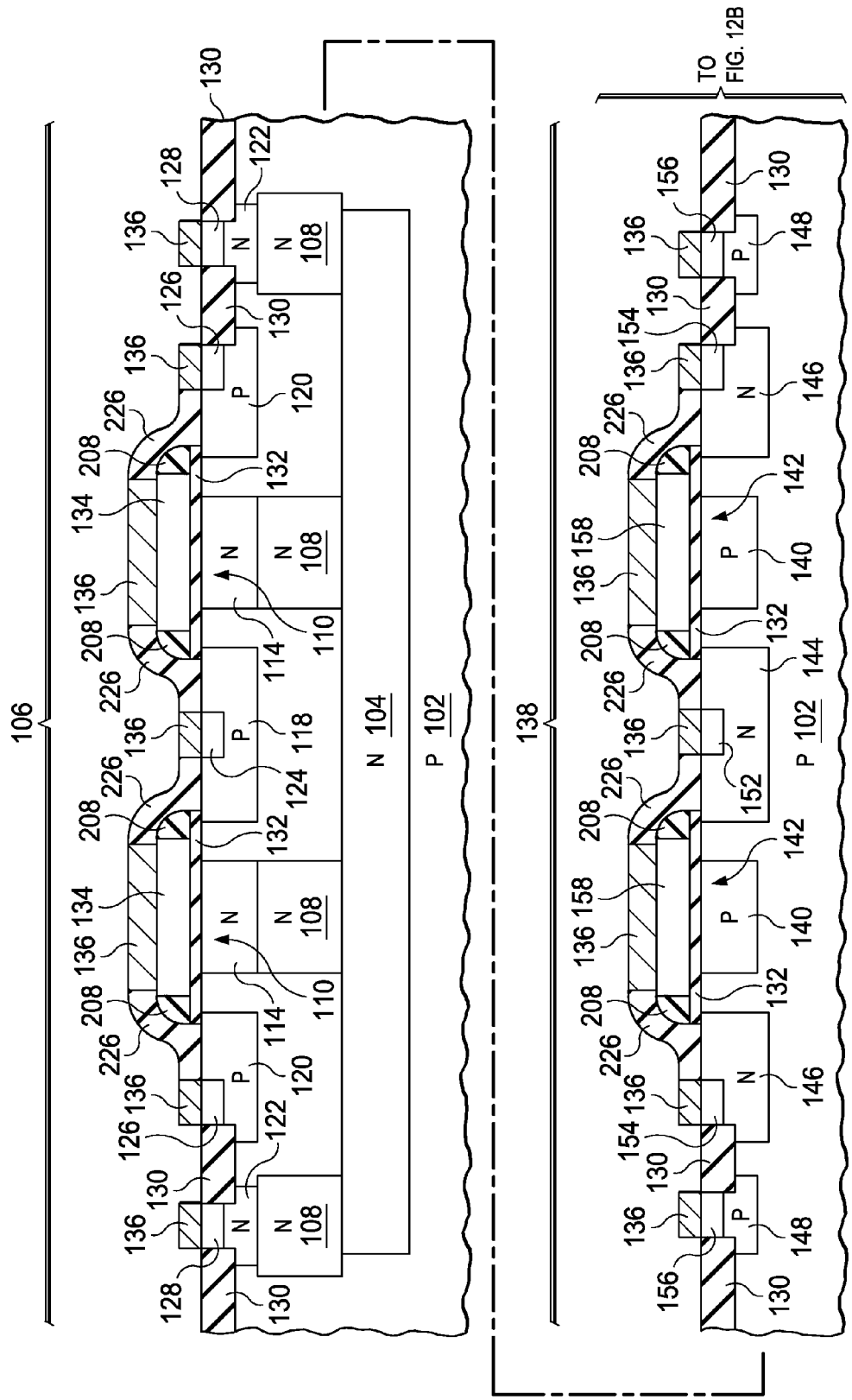
Figure 12B:
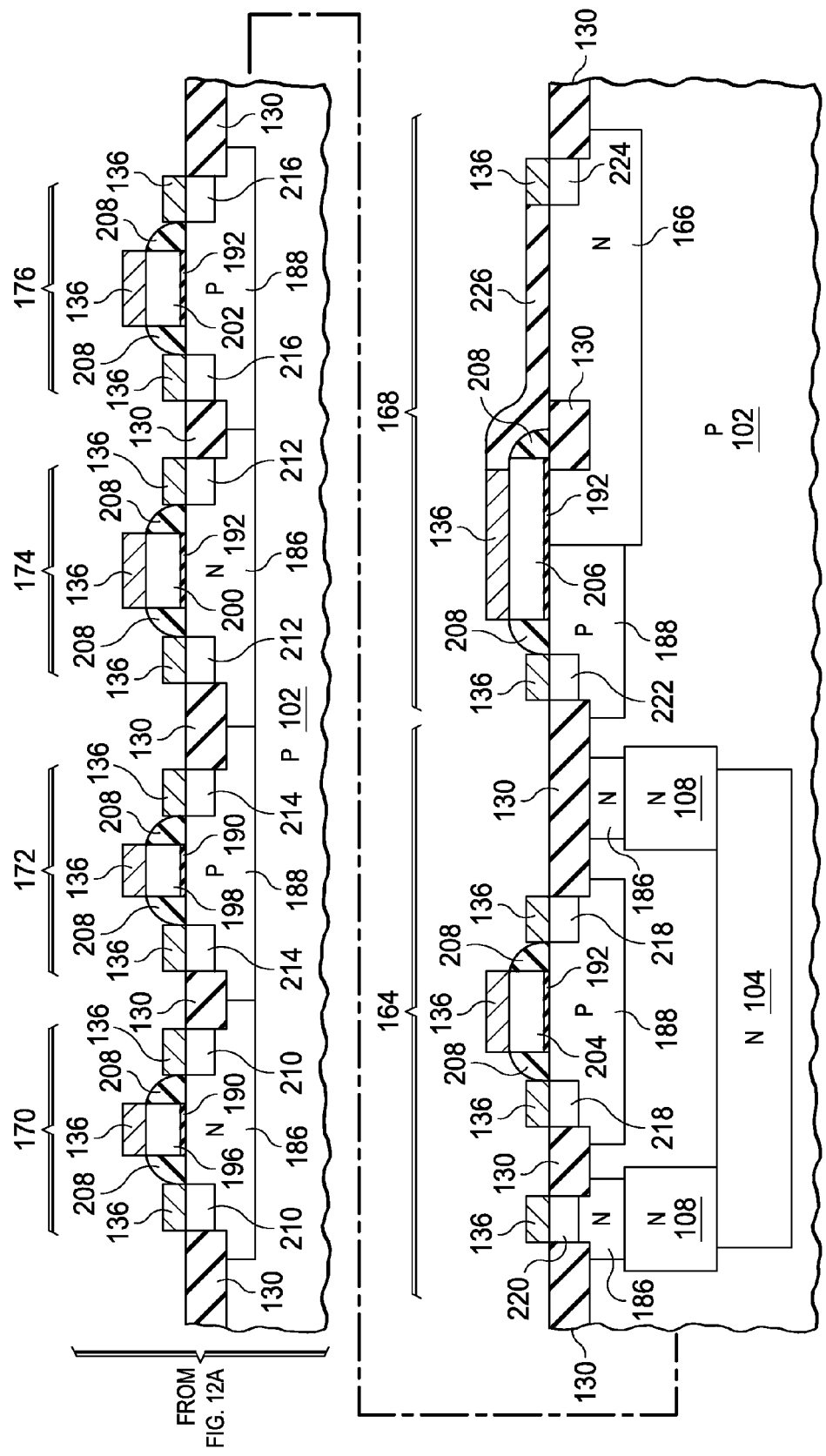

Referring to FIG. 12A and FIG. 12B, a silicide block layer 226 is formed on the integrated circuit 100 so as to block metal silicide from being formed on the lateral edges of the high-voltage PMOS gate 134, on the PMOS drain extension 118 immediately adjacent to the high-voltage PMOS gate 134, on the PMOS source extension 120 immediately adjacent to the high-voltage PMOS gate 134, on the lateral edges of the high-voltage NMOS gate 158, on the NMOS drain extension 144 immediately adjacent to the high-voltage NMOS gate 158, and on the NMOS source extension 146 immediately adjacent to the high-voltage NMOS gate 158. The silicide block layer 226 may be formed concurrently on other components in the integrated circuit 100, such as over the drain extension 166 of the extended-drain NMOS transistor 168, or on a polysilicon resistor, not shown.

The silicide block layer 226 may include one or more layers of dielectric material, such as silicon dioxide or silicon nitride, so that a thickness of the silicide block layer 226 is, for example, 20 to 100 nanometers thick. A silicon dioxide layer in the silicide block layer 226 may be formed, for example, by decomposition of TEOS. a silicon nitride layer in the silicide block layer 226 may be formed, for example, by PECVD, LPCVD or decomposition of BTBAS. The silicide block layer 226 may be formed by forming an etch mask, not shown, of photoresist over the layers of dielectric material so as to expose areas to be etched, and subsequently removing unwanted material from the dielectric layers so as to leave the silicide block layer 226.

The metal silicide 136 is formed on the PMOS drain contact region 124, the high-voltage PMOS gate 134, the PMOS source contact region 126, the PMOS body contact regions 128, the NMOS drain contact region 152, the high-voltage NMOS gate 158, the NMOS source contact region 154, the NMOS body contact regions 156, and may be concurrently formed on the first PSD regions 210, the first PMOS gate 196, the first NSD regions 214, the first NMOS gate 198, the second PSD regions 212, the second PMOS gate 200, the second NSD regions 216, the second NMOS gate 202, the isolated NSD regions 218, the isolated NMOS gate 204, the isolation contact region 220, the extended-drain source region 222, the extended-drain NMOS gate 206 and the extended-drain drain contact region 224. The metal silicide 136 may be formed by depositing one or more layers of metal, such as titanium, cobalt and/or nickel, on a top surface of the integrated circuit 100, heating the integrated circuit 100 to react a portion of the metal with exposed silicon of the integrated circuit 100, and selectively removing unreacted metal from the integrated circuit 100 surface, commonly by exposing the integrated circuit 100 to wet etchants including a mixture of an acid and hydrogen peroxide. The metal silicide 136 may be, for example, 10 to 50 nanometers thick.

The metal silicide 136 on the PMOS drain contact region 124 and the PMOS source contact region 126 is laterally separated from the high-voltage PMOS gate 134 by the silicide block layer 226. The metal silicide 136 on the high-voltage PMOS gate 134 is recessed from the lateral edges of the high-voltage PMOS gate 134 by the silicide block layer 226. Similarly, the metal silicide 136 on the NMOS drain contact region 152 and the NMOS source contact region 154 is laterally separated from the high-voltage NMOS gate 158 by the silicide block layer 226, and the metal silicide 136 on the high-voltage NMOS gate 158 is recessed from the lateral edges of the high-voltage NMOS gate 158 by the silicide block layer 226.

Figure 13A:
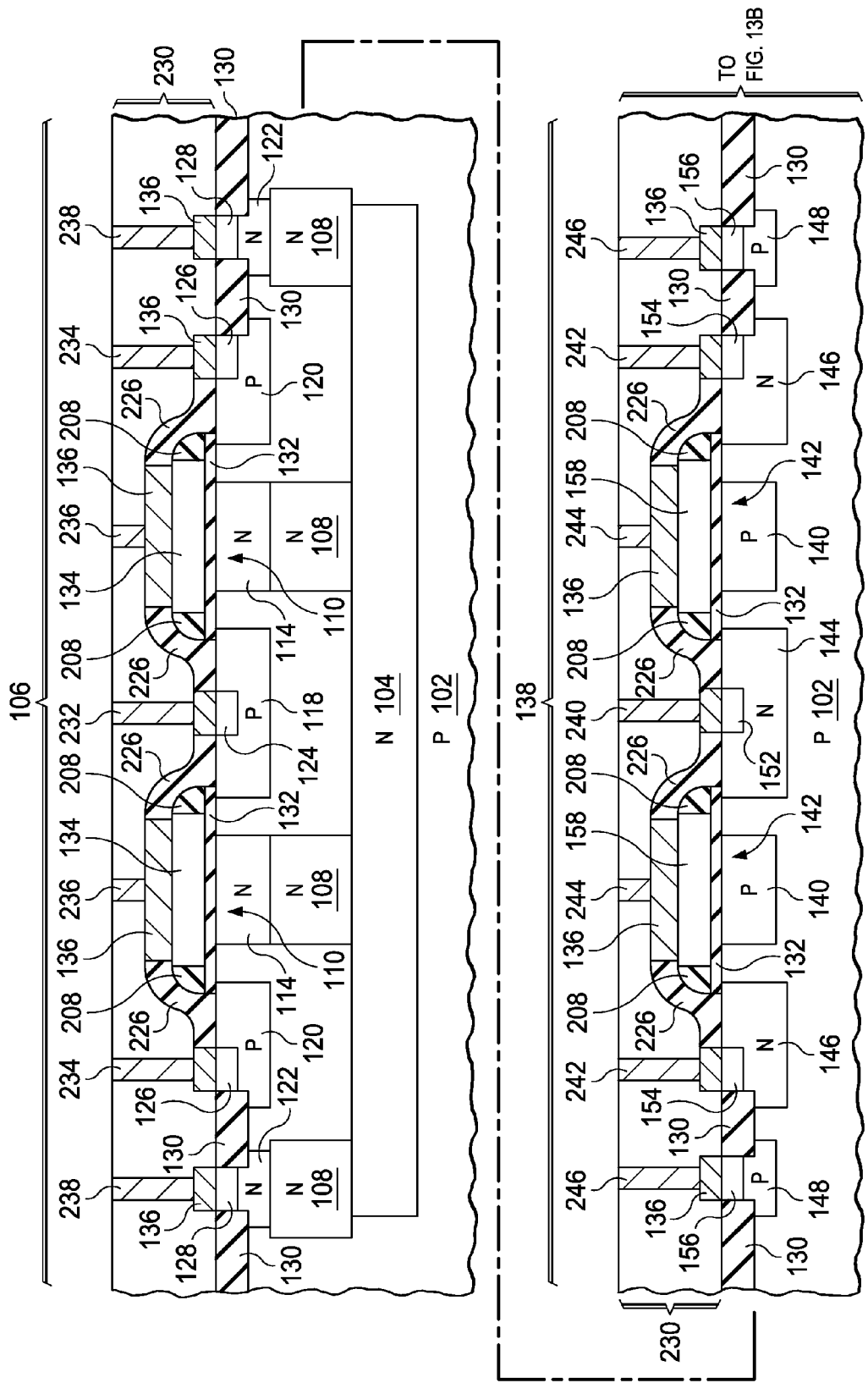
Figure 13B:
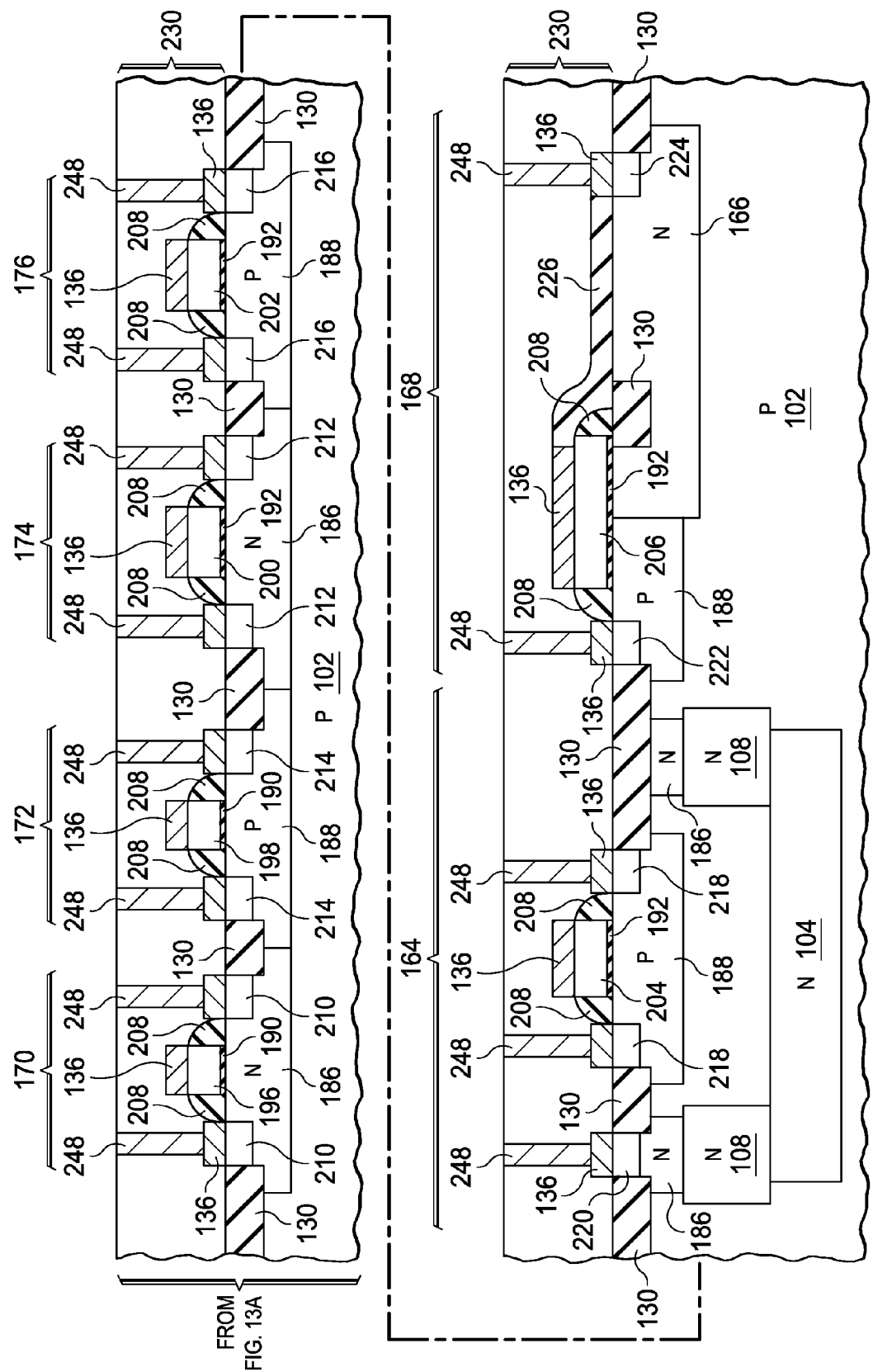

Referring to FIG. 13A and FIG. 13B, a pre-metal dielectric (PMD) layer 230 is formed on an existing top surface of the integrated circuit 100. The PMD layer 230 may be, for example, a dielectric layer stack including a PMD liner, not shown, a PMD main layer, and an optional PMD cap layer, not shown. The PMD liner is commonly silicon nitride or silicon dioxide, 10 to 100 nanometers thick, deposited by PECVD on the existing top surface of the integrated circuit 100. The PMD main layer may be a layer of silicon dioxide formed by a HARP process followed by a layer of silicon dioxide, phospho-silicate glass (PSG) or boro-phospho-silicate glass (BPSG), commonly 100 to 1000 nanometers thick, deposited by a PECVD process on a top surface of the PMD liner, and sometimes leveled by a chemical-mechanical polish (CMP) process. The optional PMD cap layer is commonly 10 to 100 nanometers of a hard material such as silicon nitride, silicon carbide nitride or silicon carbide, formed on a top surface of the PMD main layer.

Electrical contacts are formed in the PMD layer 230 to make electrical connections to the metal silicide 136, including high-voltage PMOS drain contacts 232, high-voltage PMOS source contacts 234, at least one high-voltage PMOS gate contact 236, at least one high-voltage PMOS body contact 238, high-voltage NMOS drain contacts 240, high-voltage NMOS source contacts 242, at least one high-voltage NMOS gate contact 244 and at least one high-voltage NMOS body contact 246, concurrently with other contacts 248 to other components in the integrated circuit 100, including the first PMOS transistor 170, the first NMOS transistor 172, the second PMOS transistor 174, the second NMOS transistor 176, the isolated NMOS transistor 164 and the extended-drain NMOS transistor 168.

The contacts may be formed, for example, by defining contact areas on a top surface of the PMD layer 230 with a contact photoresist pattern, not shown, etching contact holes in the contact areas by removing PMD layer material using an RIE process to expose the metal silicide layer 228, and forming a metal contact liner, such as titanium, in the contact holes, and filling the contact holes with a contact fill metal, such as tungsten, followed by removal of the contact fill metal from the top surface of the PMD layer 230 using plasma etching and/or CMP processes.

Figure 14:
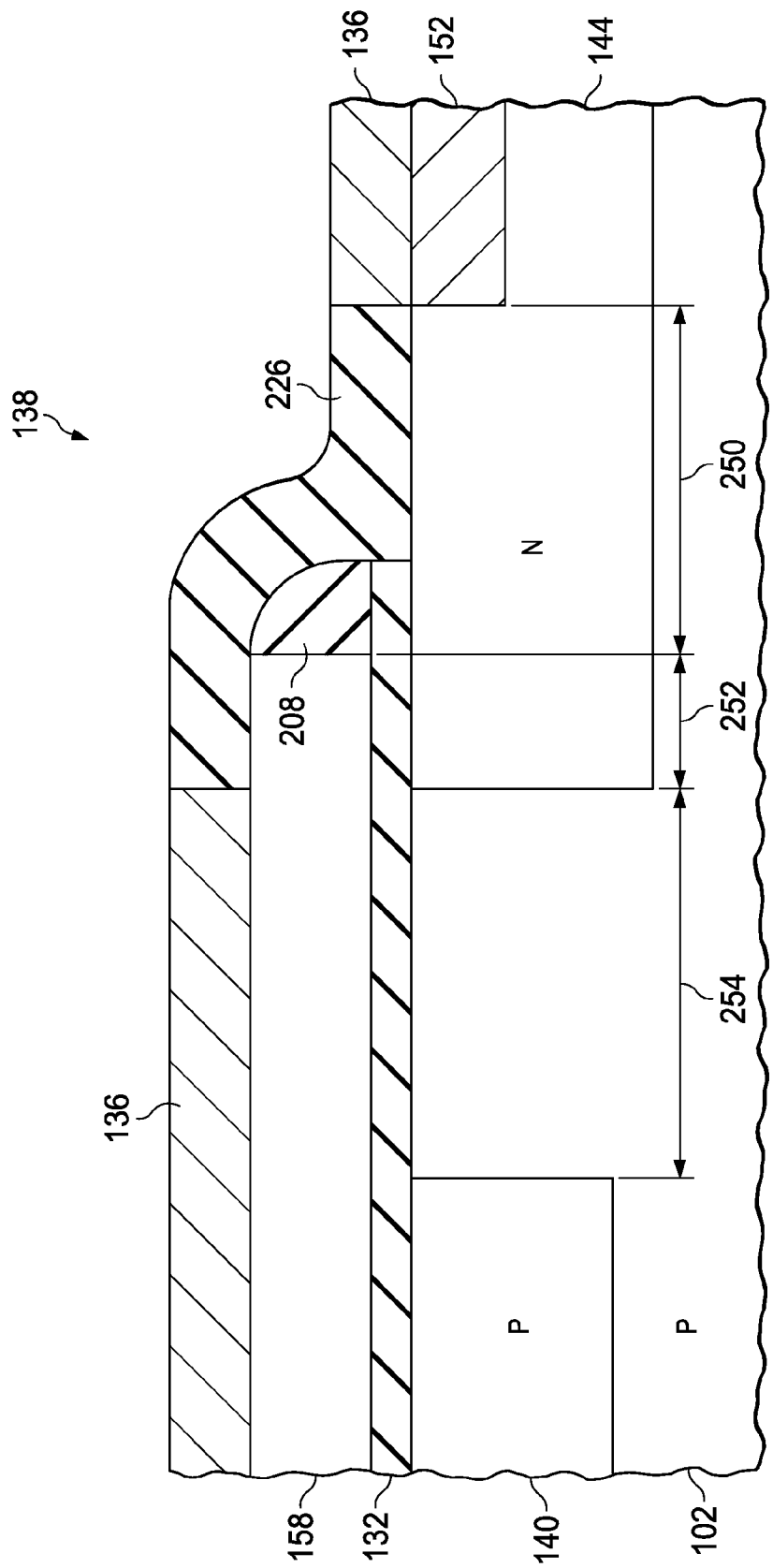
FIG. 14 depicts a portion of the n-channel high-voltage MOS transistor 138 in an embodiment in which the n-channel high-voltage MOS transistor has been formed to provide 20 volt to 22 volt operation.

FIG. 14 depicts a portion of the n-channel high-voltage MOS transistor 138 in an embodiment in which the n-channel high-voltage MOS transistor 138 has been formed to provide 20 volt to 22 volt operation. The high-voltage gate dielectric layer 132 may be, for example, 40 to 50 nanometers thick. The NMOS drain extension 144 is formed concurrently with the drain extension 166 of the extended-drain NMOS transistor 168. The NMOS drain contact region 152 and the metal silicide layer 228 on the NMOS drain contact region 152 are laterally separated from the high-voltage NMOS gate 158 by an NMOS gate-to-drain-contact spacing 250 of 550 to 1000 nanometers. The NMOS drain extension 144 underlaps the high-voltage NMOS gate 158 by an NMOS drain extension underlap length 252 of 250 to 500 nanometers. The NMOS drain extension 144 is laterally separated from the NMOS threshold adjustment region 140 by an NMOS channel depletion spacing 254 of 800 to 1200 nanometers.

Figure 15:
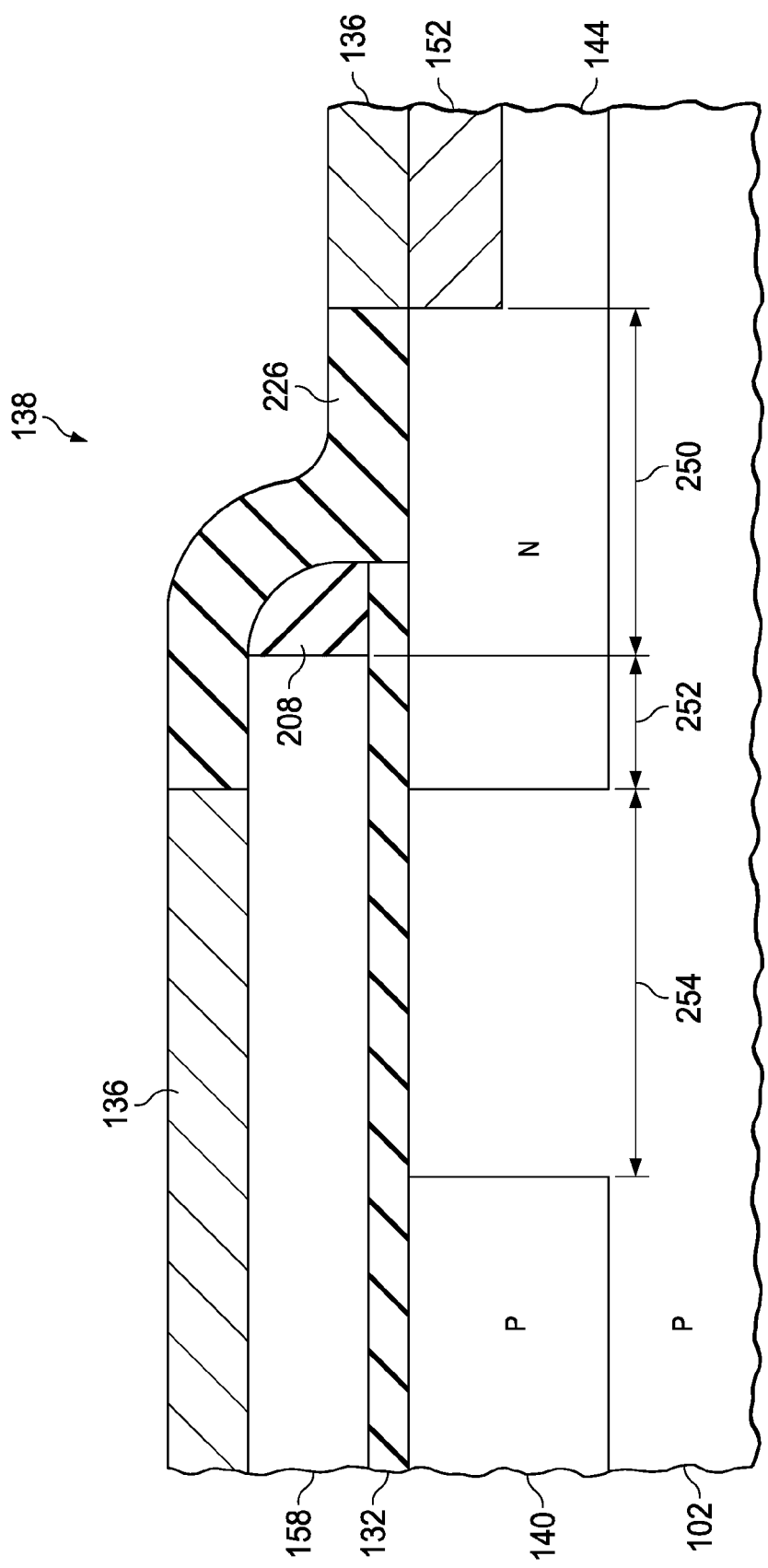
FIG. 15 depicts a portion of the n-channel high-voltage MOS transistor 138 in an embodiment in which the n-channel high-voltage MOS transistor has been formed to provide 23 volt to 27 volt operation.

FIG. 15 depicts a portion of the n-channel high-voltage MOS transistor 138 in an embodiment in which the n-channel high-voltage MOS transistor 138 has been formed to provide 23 volt to 27 volt operation. The high-voltage gate dielectric layer 132 may be, for example, 55 to 70 nanometers thick. The NMOS gate-to-drain-contact spacing 250 is 700 to 1000 nanometers. The NMOS drain extension 144 is formed concurrently with the PMOS threshold adjustment region 114 in the p-channel high-voltage MOS transistor 106. The NMOS drain extension underlap length 252 is 250 to 500 nanometers. The NMOS channel depletion spacing 254 is 800 to 1200 nanometers.

Figure 16:
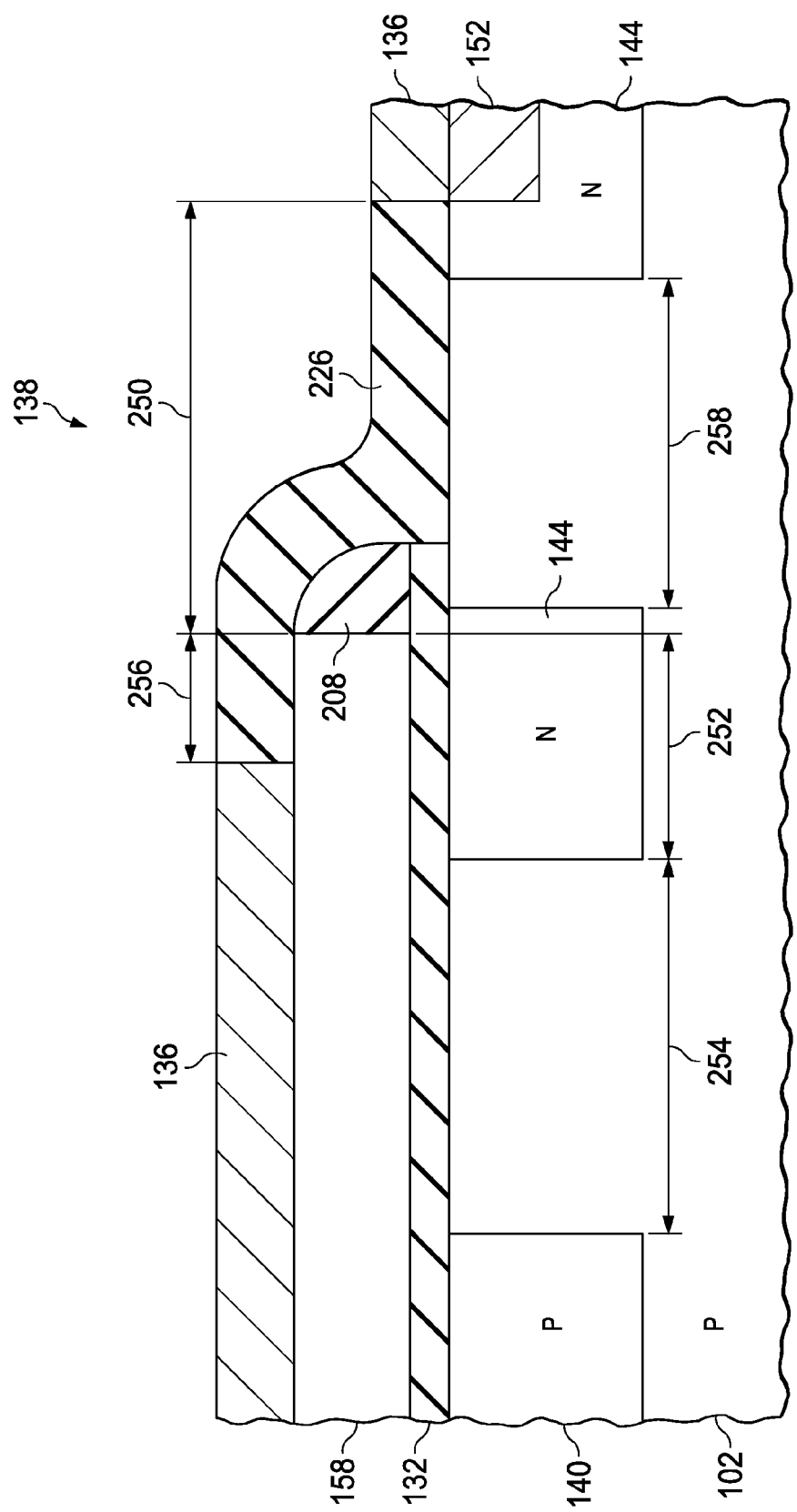
FIG. 16 depicts a portion of the n-channel high-voltage MOS transistor 138 in an embodiment in which the n-channel high-voltage MOS transistor has been formed to provide 28 volt to 30 volt operation.

FIG. 16 depicts a portion of the n-channel high-voltage MOS transistor 138 in an embodiment in which the n-channel high-voltage MOS transistor 138 has been formed to provide 28 volt to 30 volt operation. The high-voltage gate dielectric layer 132 may be, for example, 85 to 100 nanometers thick. The NMOS gate-to-drain-contact spacing 250 is 700 to 1000 nanometers. The NMOS drain extension 144 is formed concurrently with the drain extension 166 of the extended-drain NMOS transistor 168. The NMOS drain extension underlap length 252 is 400 to 750 nanometers. The NMOS channel depletion spacing 254 is 1.8 to 2.5 microns. The metal silicide layer 228 is recessed from the lateral edge of the high-voltage NMOS gate 158 by an NMOS gate silicide recess distance 256 of 300 to 500 nanometers. An NMOS drain extension gap 258 of 400 to 600 nanometers is formed in the NMOS drain extension 144.

Figure 17:
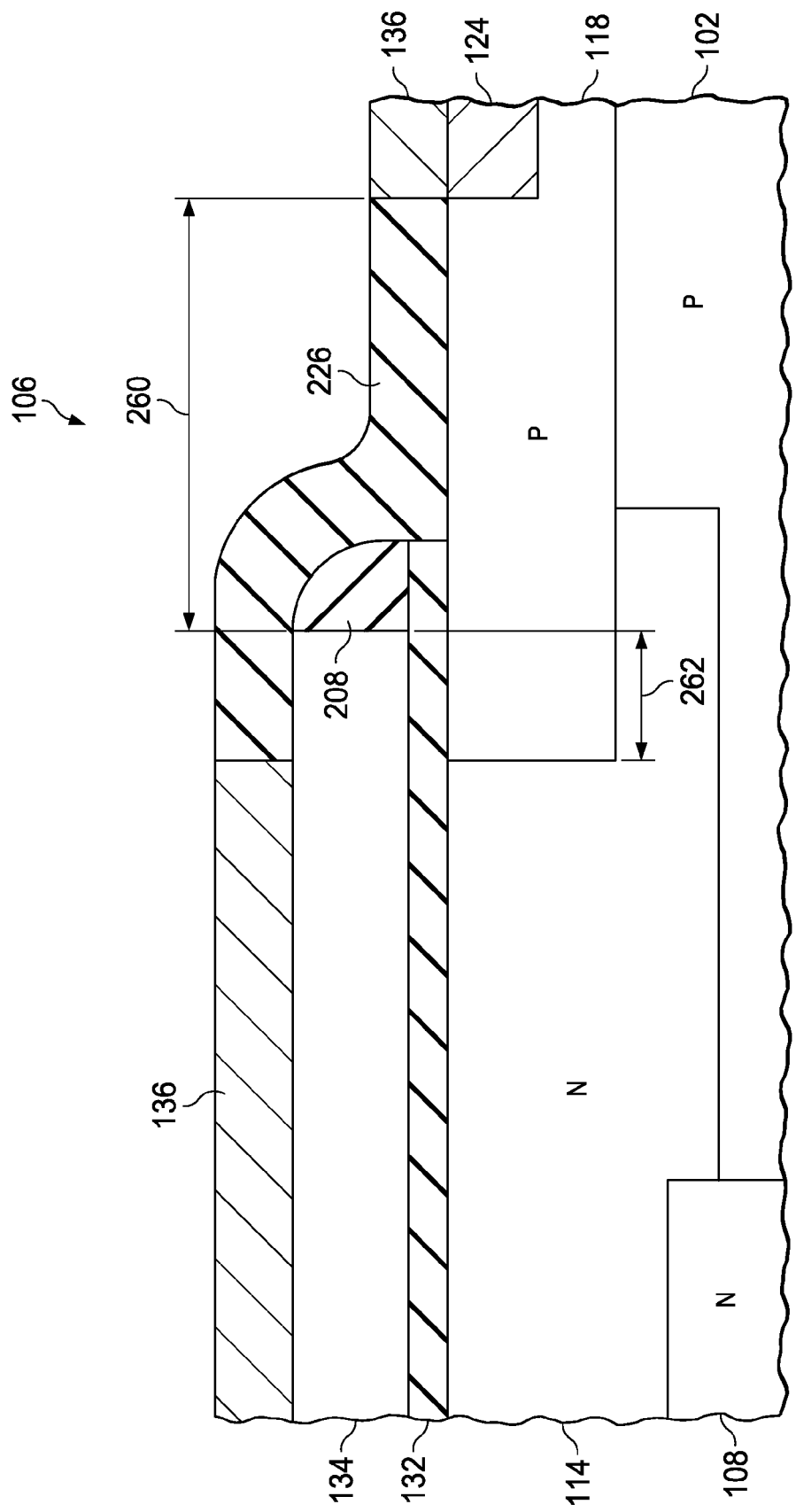
FIG. 17 depicts a portion of the p-channel high-voltage MOS transistor 106 in an embodiment in which the p-channel high-voltage MOS transistor has been formed to provide 20 volt to 22 volt operation.

FIG. 17 depicts a portion of the p-channel high-voltage MOS transistor 106 in an embodiment in which the p-channel high-voltage MOS transistor 106 has been formed to provide 20 volt to 22 volt operation. The high-voltage gate dielectric layer 132 may be, for example, 40 to 50 nanometers thick. The PMOS drain contact region 124 and the metal silicide layer 228 on the PMOS drain contact region 124 are laterally separated from the high-voltage PMOS gate 134 by a PMOS gate-to-drain-contact spacing 260 of 400 to 1000 nanometers. The PMOS drain extension 118 underlaps the high-voltage PMOS gate 134 by a PMOS drain extension underlap length 262 of 250 to 500 nanometers. The PMOS threshold adjustment region 114 contacts and underlaps the PMOS drain extension 118.

Figure 18:
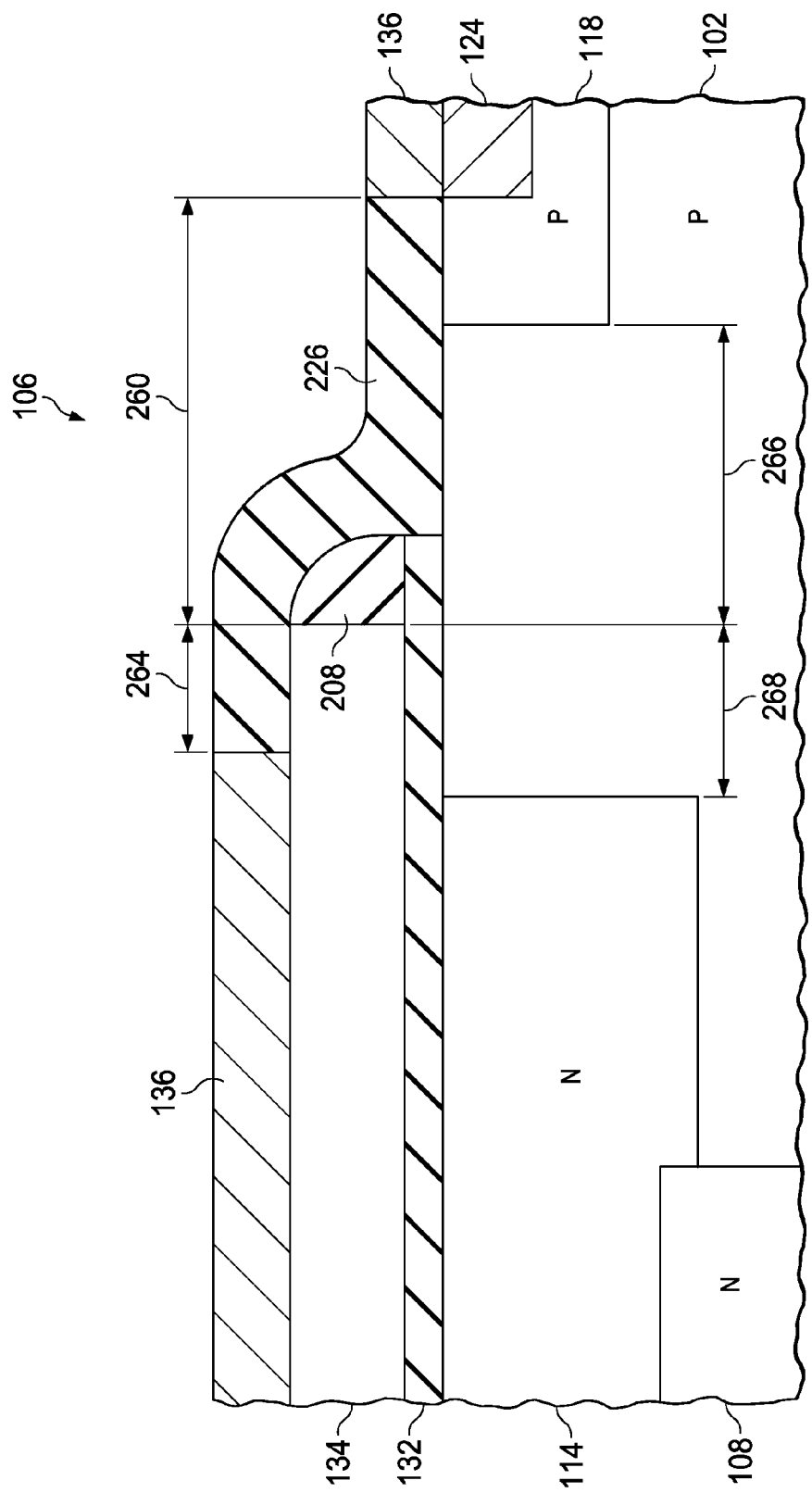
FIG. 18 depicts a portion of the p-channel high-voltage MOS transistor 106 in an embodiment in which the p-channel high-voltage MOS transistor has been formed to provide 23 volt to 27 volt operation.

FIG. 18 depicts a portion of the p-channel high-voltage MOS transistor 106 in an embodiment in which the p-channel high-voltage MOS transistor 106 has been formed to provide 23 volt to 27 volt operation. The high-voltage gate dielectric layer 132 may be, for example, 55 to 70 nanometers thick. The PMOS gate-to-drain-contact spacing 260 is 600 to 1000 nanometers. The metal silicide layer 228 is recessed from the lateral edge of the high-voltage PMOS gate 134 by a PMOS gate silicide recess distance 264 of 300 to 500 nanometers. The PMOS drain extension 118 is laterally separated from the lateral edge of the high-voltage PMOS gate 134 by a PMOS drain extension to gate spacing 266 of 200 to 400 nanometers. The PMOS threshold adjustment region 114 is recessed from the lateral edge of the high-voltage PMOS gate 134 by a PMOS threshold recess 268 of 500 to 1000 nanometers.

Figure 19:
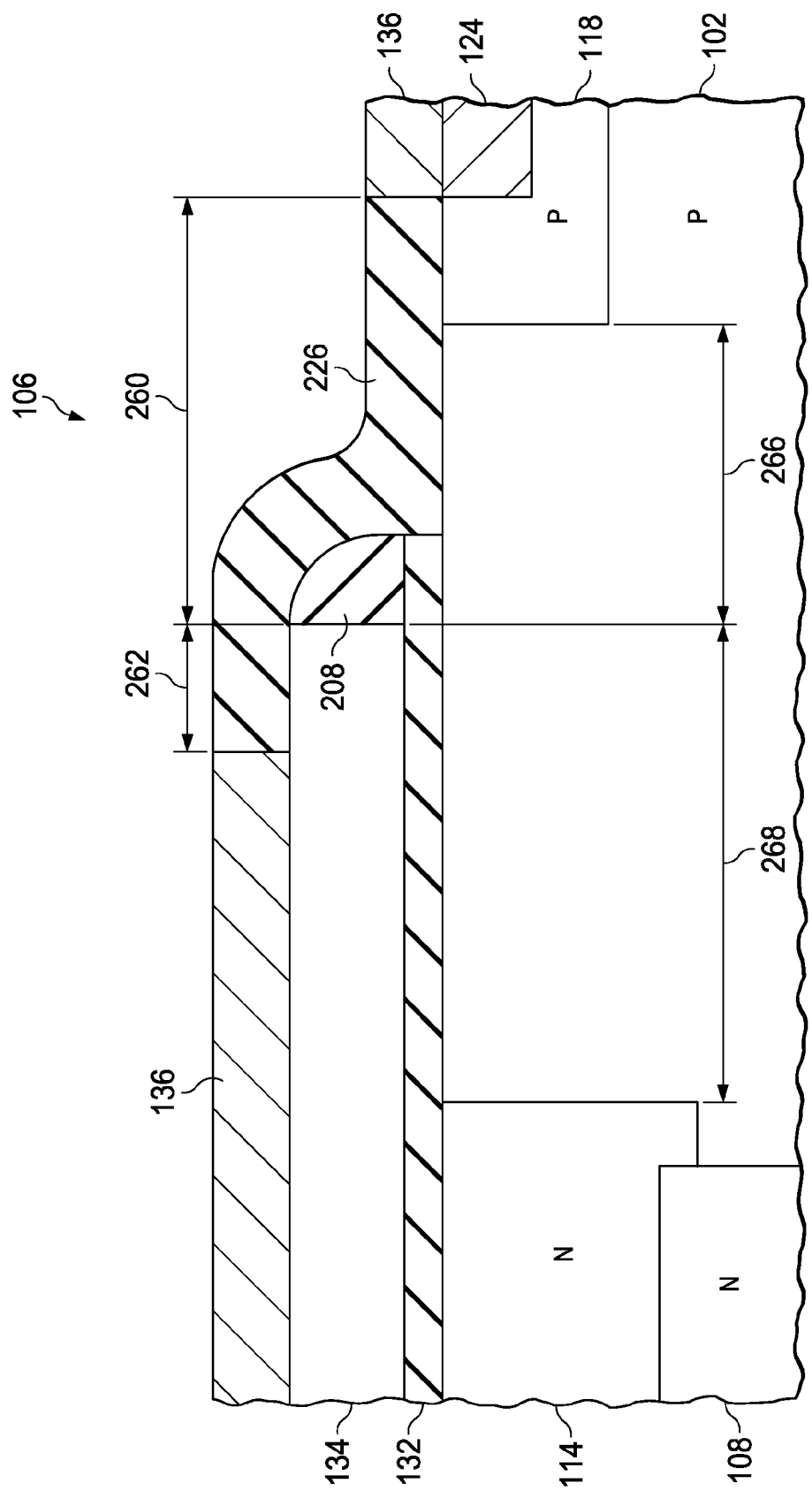
FIG. 19 depicts a portion of the p-channel high-voltage MOS transistor 106 in an embodiment in which the p-channel high-voltage MOS transistor has been formed to provide 28 volt to 30 volt operation.

FIG. 19 depicts a portion of the p-channel high-voltage MOS transistor 106 in an embodiment in which the p-channel high-voltage MOS transistor 106 has been formed to provide 28 volt to 30 volt operation. The high-voltage gate dielectric layer 132 may be, for example, 85 to 100 nanometers thick. The PMOS gate-to-drain-contact spacing 260 is 800 to 1200 nanometers. The PMOS gate silicide recess distance 264 is 300 to 500 nanometers. The PMOS drain extension to gate spacing 266 is 500 to 700 nanometers. The PMOS threshold recess 268 is 1.5 to 1.8 microns.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit having a p-channel high-voltage metal oxide semiconductor (MOS) transistor and an n-channel high-voltage MOS transistor, comprising:

a substrate comprising a p-type semiconductor;
an n-type n-channel metal oxide semiconductor (NMOS) drain extension and an n-type NMOS source extension of said n-channel high-voltage MOS transistor;
an n-type p-channel metal oxide semiconductor (PMOS) threshold adjustment region of said p-channel high-voltage MOS transistor, said PMOS threshold adjustment region being electrically coupled to an n-type buried layer;
a high-voltage gate dielectric layer at a top surface of said substrate in said p-channel high-voltage MOS transistor and in said n-channel high-voltage MOS transistor;
a p-type NMOS threshold adjustment region of said n-channel high-voltage MOS transistor;
a PMOS drain extension and a PMOS source extension of said p-channel high-voltage MOS transistor, wherein the PMOS drain extension and PMOS source extension are spaced apart from the PMOS threshold adjustment region; and
a high-voltage PMOS gate of said p-channel high-voltage MOS transistor and a high-voltage NMOS gate of said n-channel high-voltage MOS transistor;
such that:
said high-voltage PMOS gate has a drain-centered closed loop configuration;
said high-voltage PMOS gate does not overlap field oxide;
said high-voltage NMOS gate has a drain-centered closed loop configuration;
said high-voltage NMOS gate does not overlap field oxide;
said PMOS drain extension is free of field oxide;
said PMOS source extension between a PMOS source contact region and said PMOS threshold adjustment region is free of field oxide;
said NMOS drain extension is free of field oxide; and
said NMOS source extension between a NMOS source contact region and said NMOS threshold adjustment region is free of field oxide.

2. The integrated circuit of claim 1, in which:
said high-voltage gate dielectric layer is 40 to 50 nanometers thick;
an NMOS drain contact region and a metal silicide layer on said NMOS drain contact region are laterally separated from said high-voltage NMOS gate by an NMOS gate-to-drain-contact spacing of 550 to 1000 nanometers;
said NMOS drain extension underlaps said high-voltage NMOS gate by an NMOS drain extension underlap length of 250 to 500 nanometers; and
said NMOS drain extension is laterally separated from said NMOS threshold adjustment region by an NMOS channel depletion spacing of 800 to 1200 nanometers.

3. The integrated circuit of claim 1, in which:
said high-voltage gate dielectric layer is 55 to 70 nanometers thick;
an NMOS drain contact region and a metal silicide layer on said NMOS drain contact region are laterally separated from said high-voltage NMOS gate by an NMOS gate-to-drain-contact spacing of 700 to 1000 nanometers;
said NMOS drain extension underlaps said high-voltage NMOS gate by an NMOS drain extension underlap length of 250 to 500 nanometers; and
said NMOS drain extension is laterally separated from said NMOS threshold adjustment region by an NMOS channel depletion spacing of 800 to 1200 nanometers.

4. The integrated circuit of claim 1, in which:
said high-voltage gate dielectric layer is 85 to 100 nanometers thick;
an NMOS drain contact region and a metal silicide layer on said NMOS drain contact region are laterally separated from said high-voltage NMOS gate by an NMOS gate-to-drain-contact spacing of 700 to 1000 nanometers;
said NMOS drain extension underlaps said high-voltage NMOS gate by an NMOS drain extension underlap length of 400 to 750 nanometers;
said NMOS drain extension is laterally separated from said NMOS threshold adjustment region by an NMOS channel depletion spacing of 1.8 to 2.5 microns;
a metal silicide layer on said high-voltage NMOS gate is recessed from said lateral edges of said high-voltage NMOS gate by an NMOS gate silicide recess distance of 300 to 500 nanometers; and
an NMOS drain extension gap of 400 to 600 nanometers is formed in said NMOS drain extension.

5. The integrated circuit of claim 1, in which:
said high-voltage gate dielectric layer is 40 to 50 nanometers thick;
a PMOS drain contact region and a metal silicide layer on said PMOS drain contact region are laterally separated from said high-voltage PMOS gate by a PMOS gate-to-drain-contact spacing of 400 to 1000 nanometers;
said PMOS drain extension underlaps said high-voltage PMOS gate by a PMOS drain extension underlap length of 250 to 500 nanometers; and
said PMOS threshold adjustment region contacts and underlaps said PMOS drain extension.

6. The integrated circuit of claim 1, in which:
said high-voltage gate dielectric layer is 55 to 70 nanometers thick;
said PMOS drain contact region and a metal silicide layer on said PMOS drain contact region are laterally separated from said high-voltage PMOS gate by a PMOS gate-to-drain-contact spacing of 600 to 1000 nanometers;
a metal silicide layer on said high-voltage PMOS gate is recessed from said lateral edges of said high-voltage PMOS gate by a PMOS gate silicide recess distance of 300 to 500 nanometers;
said PMOS drain extension is laterally separated from said lateral edge of said high-voltage PMOS gate by a PMOS drain extension to gate spacing of 200 to 400 nanometers; and
said PMOS threshold adjustment region is recessed from said lateral edge of said high-voltage PMOS gate by a PMOS threshold recess of 500 to 1000 nanometers.

7. The integrated circuit of claim 1, in which:
said high-voltage gate dielectric layer is 85 to 100 nanometers thick;
a PMOS drain contact region and a metal silicide layer on said PMOS drain contact region are laterally separated from said high-voltage PMOS gate by a PMOS gate-to-drain-contact spacing of 800 to 1000 nanometers;
a metal silicide layer on said high-voltage PMOS gate is recessed from said lateral edges of said high-voltage PMOS gate by a PMOS gate silicide recess distance of 300 to 500 nanometers;
said PMOS drain extension is laterally separated from said lateral edge of said high-voltage PMOS gate by a PMOS drain extension to gate spacing of 500 to 700 nanometers; and
said PMOS threshold adjustment region is recessed from said lateral edge of said high-voltage PMOS gate by a PMOS threshold recess of 1.5 to 1.8 microns.

8. An integrated circuit comprising:
a substrate comprising a p-type semiconductor;
a drain-centered high voltage p-channel metal oxide semiconductor (PMOS) transistor having:
  a PMOS gate dielectric layer at a top surface of the substrate;
  a PMOS gate on the PMOS gate dielectric layer, wherein the PMOS gate does not overlap field oxide;
  an n-type PMOS threshold adjustment region, said PMOS threshold adjustment region being electrically coupled to an n-type buried layer;
  a PMOS drain extension and a PMOS source extension, wherein the PMOS drain extension and PMOS source extension are spaced apart from the PMOS threshold adjustment region and wherein the PMOS drain extension is free of field oxide; and
  a PMOS drain in the PMOS drain extension and an PMOS source in the PMOS source extension, wherein the high-voltage PMOS gate surrounds the PMOS drain, and wherein the PMOS source extension between the PMOS source and the PMOS threshold adjustment region is free of field oxide; and
a drain centered high-voltage n-channel metal oxide semiconductor (NMOS) transistor having:
  an n-type NMOS drain extension and an n-type NMOS source extension;
  a p-type NMOS threshold adjustment region;
  an NMOS drain in the NMOS drain extension and an NMOS source in the NMOS source extension, wherein the NMOS drain extension is free of field oxide and the NMOS source extension between the NMOS source and the NMOS threshold adjustment region is free of field oxide;
  an NMOS gate dielectric layer at the top surface of the substrate; and
  an NMOS gate on the NMOS gate dielectric layer, wherein the NMOS gate surrounds the NMOS drain and the NMOS gate does not overlap field oxide.

* * * * *